(12) United States Patent
Shu et al.

(10) Patent No.: US 11,688,805 B2
(45) Date of Patent: Jun. 27, 2023

(54) INTEGRATED CIRCUIT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Cheng-Bo Shu, Tainan (TW); Yun-Chi Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 17/333,635

(22) Filed: May 28, 2021

(65) Prior Publication Data

US 2022/0384642 A1    Dec. 1, 2022

(51) Int. Cl.
| | |
|---|---|
| H01L 29/78 | (2006.01) |
| H01L 21/8234 | (2006.01) |
| H01L 27/088 | (2006.01) |
| H01L 29/40 | (2006.01) |
| H01L 29/66 | (2006.01) |
| H01L 29/49 | (2006.01) |

(52) U.S. Cl.
CPC .. H01L 29/7823 (2013.01); H01L 21/823418 (2013.01); H01L 21/823475 (2013.01); H01L 27/088 (2013.01); H01L 29/401 (2013.01); H01L 29/404 (2013.01); H01L 29/6656 (2013.01); H01L 29/66659 (2013.01); H01L 29/66681 (2013.01); H01L 29/7835 (2013.01)

(58) Field of Classification Search
CPC ......... H01L 29/66568–66659; H01L 29/66681–66704; H01L 29/7816–7826; H01L 29/402–407; H01L 21/823462; H01L 29/41758; H01L 29/7835; H01L 21/823412; H01L 21/823807; H01L 29/1054; H01L 21/823425; H01L 21/823814; H01L 21/823418; H01L 29/7823; H01L 29/401–407
See application file for complete search history.

(56) References Cited

U.S. PATENT DOCUMENTS

| | | | | |
|---|---|---|---|---|
| 7,652,343 B2* | 1/2010 | Mabuchi | ........... | H01L 27/14603 257/222 |
| 2006/0081836 A1* | 4/2006 | Kimura | ............... | H01L 29/7835 257/E29.12 |
| 2017/0373138 A1* | 12/2017 | Birner | ............... | H01L 21/26513 |

* cited by examiner

*Primary Examiner* — Sonya McCall-Shepard
(74) *Attorney, Agent, or Firm* — Birch, Stewart, Kolasch & Birch, LLP

(57) ABSTRACT

A method for forming an integrated circuit structure is provided. The method includes forming a gate dielectric layer over a semiconductor substrate; depositing a first gate electrode layer over the gate dielectric layer; etching the first gate electrode layer to form a gate electrode over the gate dielectric layer; forming a drift region in the semiconductor substrate; depositing a dielectric layer over the gate dielectric layer and the gate electrode, in which the dielectric layer has a first portion alongside a first sidewall of the gate electrode; depositing a second gate electrode layer over the dielectric layer; etching the second gate electrode layer to form a field plate electrode alongside the first portion of the dielectric layer; and forming source/drain features in the semiconductor substrate.

20 Claims, 34 Drawing Sheets

US 11,688,805 B2

INTEGRATED CIRCUIT STRUCTURE AND METHOD FOR FORMING THE SAME

BACKGROUND

Power metal-oxide-semiconductor field-effect transistors (MOSFETs) are MOSFETs designed to handle significant power levels, such as high voltages and/or high currents. Power MOSFETs find application in display drivers, power converters, motor controllers, vehicle power devices, and so on. One type of power MOSFET is a laterally-diffused metal-oxide semiconductor (LDMOS) transistor. LDMOS transistors have high gain, high power output, and high efficiency at high frequencies, such that LDMOS transistors are used with microwave and radio frequency (RF) power amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
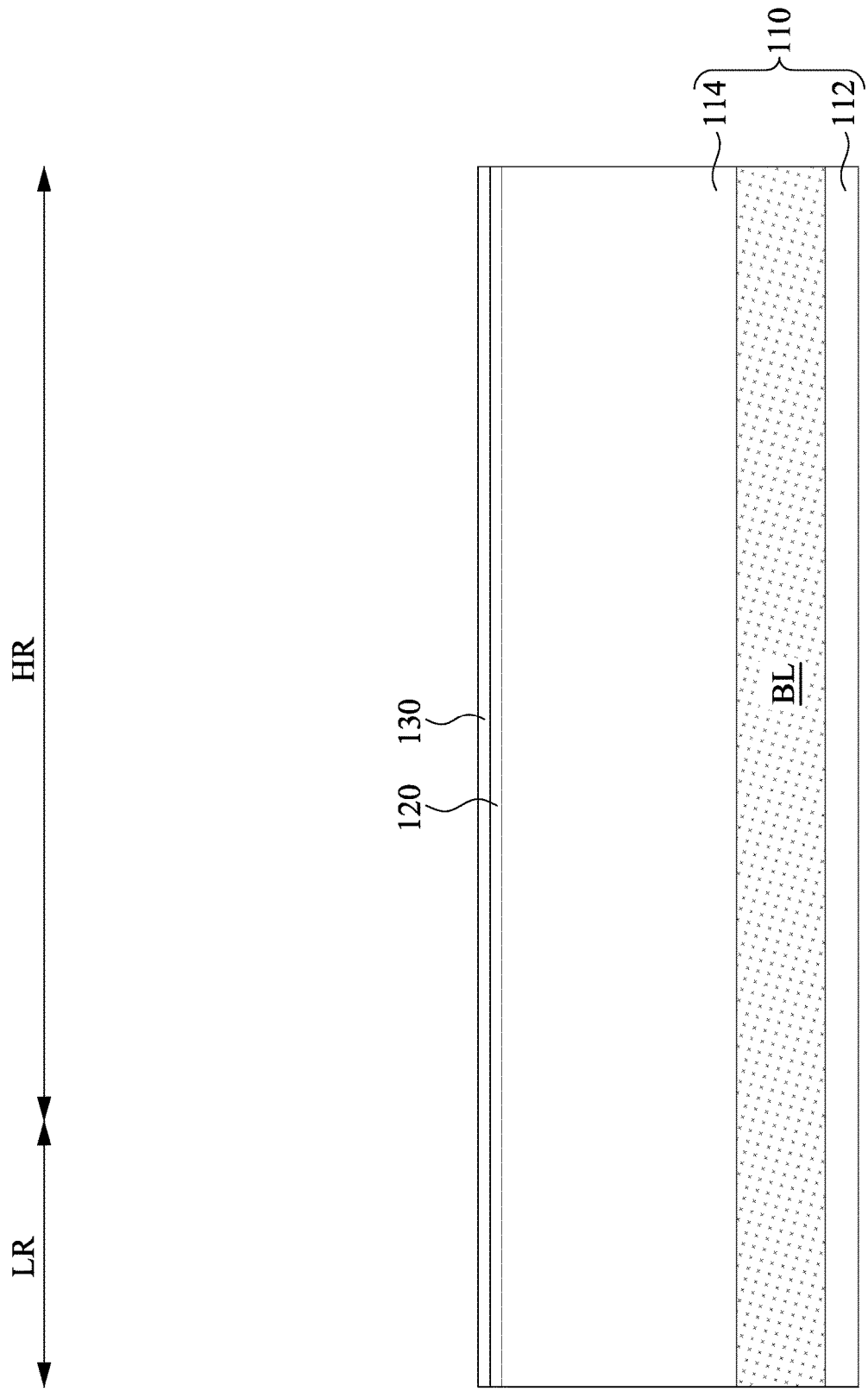
FIGS. 1-22 illustrate cross-sectional views of a method of manufacturing an integrated circuit (IC) structure at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The following disclosure will continue with exemplary lateral double-diffused metal oxide semiconductor (LDMOS) device fabrication to illustrate various embodiments of the present disclosure. In some embodiments of present disclosure, the LDMOS device, for example, a p-type LDMOS (PLDMOS) device, has a field plate adapted to result in a balanced distribution of the electric field to reduce its peak value on the drain side. A bipolar-complementary metal oxide semiconductor (CMOS)-double diffused metal oxide semiconductor (DMOS) (BCD) process technology is developed to integrate transistor devices, such as bipolar devices, complementary metal oxide semiconductor (CMOS) transistors, and LDMOS transistors, into one chip so as to form a smart power integrated circuit. Embodiments of the disclosure may also be applied, however, to other devices and structures.

FIGS. 1-22 illustrate a method of manufacturing an integrated circuit (IC) structure at various stages in accordance with some embodiments. It is understood that additional operations may be provided before, during, and after the operations shown by FIGS. 1-22, and some of the operations described below can be replaced or eliminated for additional embodiments of the method. The order of the operations/processes may be interchangeable.

Reference is made to FIG. 1. A semiconductor substrate 110 is provided. The semiconductor substrate 110 may include a base substrate 112, a buried layer BL, and a semiconductor layer 114 over the base substrate 112. The base substrate 112 may be a bulk substrate, such as a bulk silicon substrate. The buried layer BL may be a doped buried layer formed in a top portion of the base substrate 112 through suitable semiconductor doping techniques such as an ion implantation process in some embodiments. The implantation process may be performed with n-type dopants, such as phosphorus, antimony, or arsenic, and/or p-type dopants, such as boron or $BF_2$, depending on design requirements. In other words, the buried layer BL may be an n-type buried layer (NBL) or a p-type buried layer (PBL). In some embodiments, the doped buried layer BL has a first doping type opposite to a second doping type of the base substrate 112 and the semiconductor layer 114. The first doping type and the second doping type may respectively be n-type and p-type, or vice versa. In some embodiments, the doping concentration of the buried layer BL is in a range from about $1\times10^{15}/cm^3$ to about $1\times10^{18}/cm^3$. In the present embodiments, for forming a PLDMOS device, an n-type doped buried layer BL is formed in the p-type semiconductor substrate 110 for forming isolated devices. Other oxide materials could be used for the buried oxide layer. After the formation of the buried layer BL, the semiconductor layer 114 is then epitaxially grown over the base substrate 112. The semiconductor layer 114 may include an elementary semiconductor, such as silicon (Si) in a crystalline structure, germanium (Ge) in a crystalline structure, a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. In some alternative embodiments, the buried layer BL may be a buried dielectric layer including a buried oxide (BOX) layer. For example, a buried oxide layer may include a thick silicon oxide layer that is grown or deposited overlying the silicon base substrate 112. The semiconductor substrate 110 may include a logic region LR for accommodating logic devices and a high voltage region HR for accommodating high voltage devices, such as PLDMOS.

A pad layer 120 and a hard mask layer 130 are formed over the substrate 110. The pad layer 120 may be a thin film comprising silicon oxide formed using, for example, a thermal oxidation process. The pad layer 120 may act as an adhesion layer between the substrate 110 and the hard mask layer 130. The pad layer 120 may also act as an etch stop layer for etching the hard mask layer 130 in subsequent process. In some embodiments, the hard mask layer 130 is formed of a dielectric material, such as silicon nitride, for example, and is formed using low-pressure chemical vapor deposition (LPCVD) or plasma enhanced chemical vapor deposition (PECVD).

Figure 2:
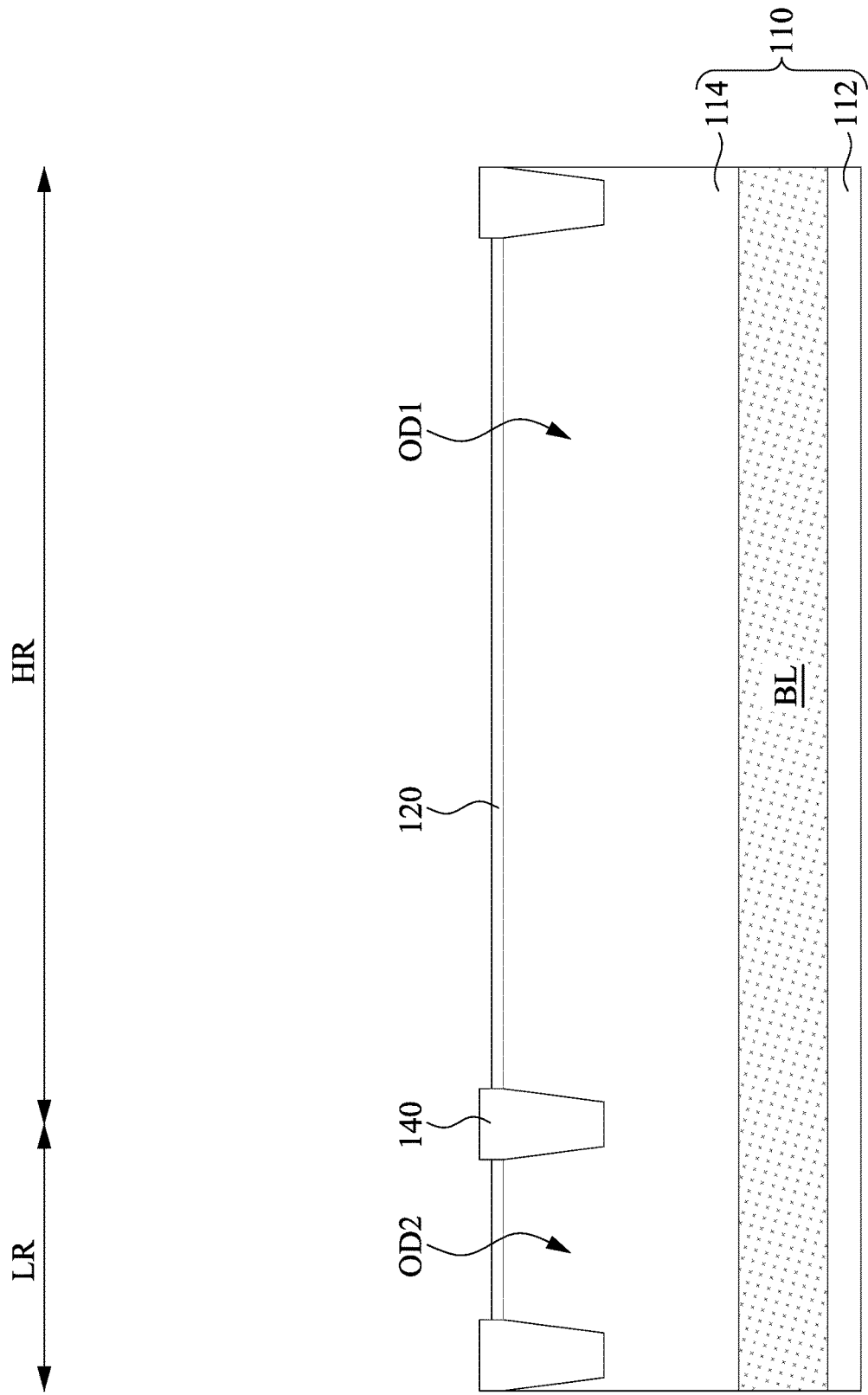

Reference is made to FIG. 2. Plural isolation structures 140 are formed in the hard mask layer 130 (referring to FIG. 1), the pad layer 120, and the substrate 110. The isolation structures 140 may define plural regions OD1 and OD2 respectively in the high voltage region HR and the logic region LR of the substrate 110. In some embodiments, the isolation structures 140 are made of silicon oxide, silicon nitride, silicon oxynitride, fluoride-doped silicate glass (FSG), or other low-K dielectric materials. For example, the hard mask layer 130 (referring to FIG. 1), the pad layer 120, and the semiconductor substrate 110 are patterned by a suitable etching process to form trenches therein, and a dielectric material may overfill the trenches. A chemical mechanical polish (CMP) process is then performed to remove the excess dielectric material external to the trenches and substantially level the top surface of the dielectric material to the top surfaces of the hard mask layer 130 (referring to FIG. 1), thereby forming the isolation structures 140. In some embodiments, the hard mask layer 130 (referring to FIG. 1) may serve as an CMP stop layer that has a higher resistance to the CMP process than that of the dielectric material, such that the CMP process is performed until reaching a top surface of the hard mask layer 130 (referring to FIG. 1).

After the formation of the isolation structure 140, the hard mask layer 130 (referring to FIG. 1) is removed by a suitable etching process. For example, etchants for removing silicon nitride, such as phosphorus acid, are used to remove the hard mask layer 130 (referring to FIG. 1). In some embodiments, the pad layer 120 and the isolation structure 140 have a higher etch resistance to the etchants than that of the hard mask layer 130 (referring to FIG. 1), such that materials under the pad layer 120 and the isolation structure 140 are prevented from being etched by the etching process.

Figure 3:
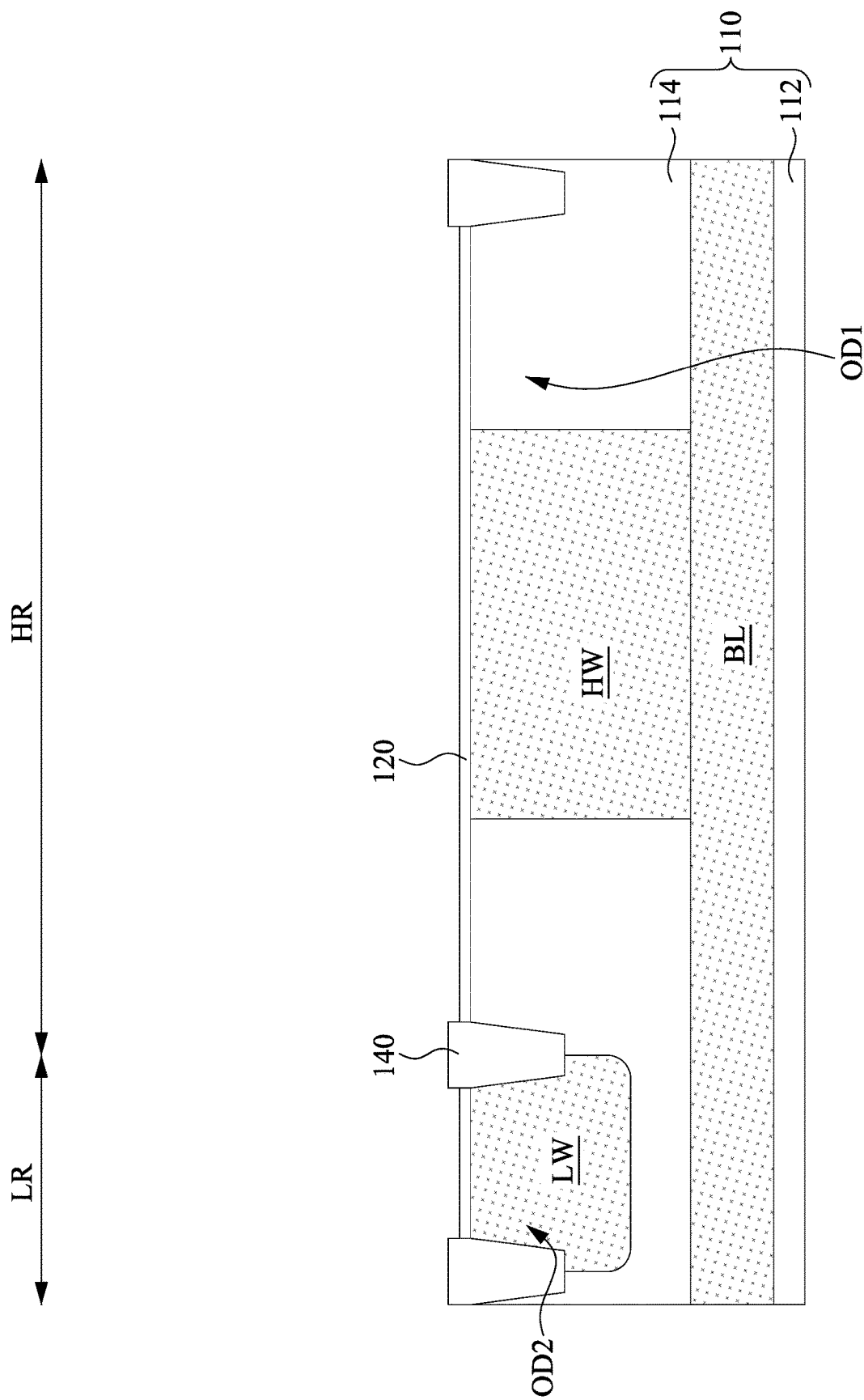

Reference is made to FIG. 3. One or more high voltage well regions HW are formed through suitable semiconductor doping techniques such as an ion implantation process in some embodiments. The implantation process may be performed with n-type dopants, such as phosphorus, antimony, or arsenic, and/or p-type dopants, such as boron or $BF_2$, depending on design requirements. In some embodiments, for forming the PLDMOS device, the high voltage well region HW may be n-type wells doped with n-type dopants. In some alternative embodiments, for forming the NLDMOS, the high voltage well region HW may be p-type wells doped with p-type dopants. In some embodiments, the doping concentration of the high voltage well region HW is in a range from about $1\times10^8/cm^3$ to about $1\times10^{14}/cm^3$. By controlling the ion implantation energy, the dopants may penetrate through the top surface of the semiconductor substrate 110, and the depth of the high voltage well region HW may be adjusted accordingly.

One or more logic well regions LW are formed through suitable semiconductor doping techniques such as an ion implantation process in some embodiments. The implantation process may be performed with n-type dopants, such as phosphorus, antimony, or arsenic, and/or p-type dopants, such as boron or $BF_2$, depending on design requirements. In some embodiments, the doping concentration of the logic well region LW is in a range from about $1\times10^8/cm^3$ to about $1\times10^{14}/cm^3$. By controlling the ion implantation energy, the dopants may penetrate through the top surface of the semiconductor substrate 110, and the depth of the logic well region LW may be adjusted accordingly.

The pad layer 120 may serve as a screen oxide during the implantation processes of the high voltage well region HW and the logic well region LW. In some embodiments, the screen oxide is beneficial for stopping the low energy debris that comes along with the high-energy ion beam. In some embodiments, the screen oxide may scatter the main ion beam and thus prevent deep penetration of the ions if the beam happens to be aligned with a major crystallographic direction.

Figure 4:
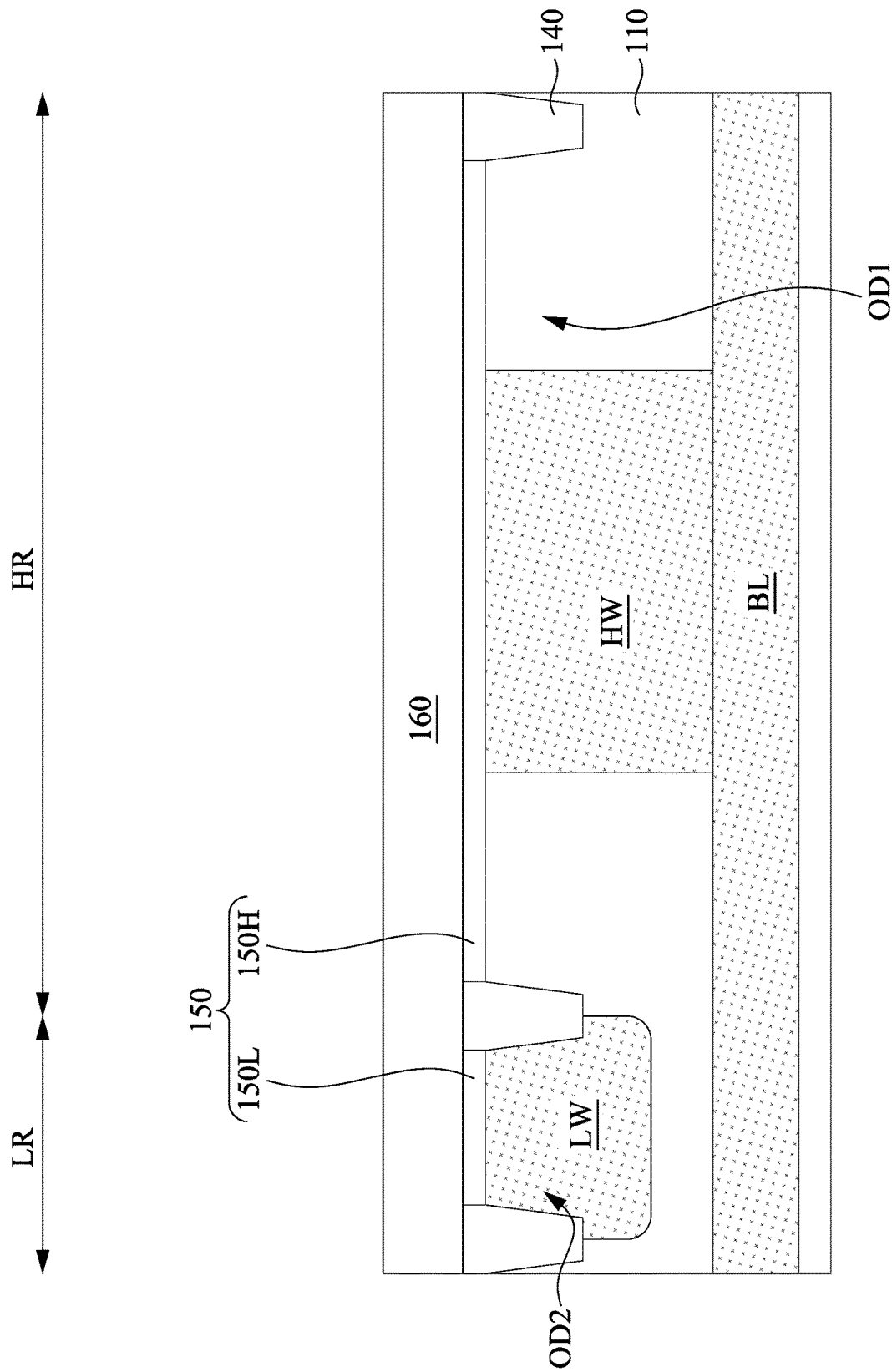

Reference is made to FIG. 4. After the implantation processes of the high voltage well region HW and the logic well region LW, the pad layer 120 is removed by a suitable etching process. In some embodiments, the substrate 110 may have a higher resistance to the etching process that removes the pad layer 120 than that of the pad layer 120, such that the regions OD1 and OD2 may not be substantially etched by the etching process. The removal of the pad layer 120 may leave the regions OD1 and OD2 exposed.

A gate dielectric layer 150 may be formed over the exposed regions OD1 and OD2. The gate dielectric layer 150 may be formed of a suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. In some embodiments, the gate dielectric layer 150 is formed by a thermal oxidation process. In some alternative embodiments, the gate dielectric layer 150 may be formed by a thermal oxidation process, a CVD process, other suitable deposition processes, or the combinations thereof as well. The formed gate dielectric layer 150 may have a portion 150H over the region OD1 and a portion 150L over the region OD2. In some embodiments, the formation of the gate dielectric layer 150 may also form a thin layer over the top surfaces of the isolation structures 140. In some embodiments, a top surface of the gate dielectric layer 150 is substantially level with the top surfaces of the isolation structures 140. In some alternative embodiments, a top surface of the gate dielectric layer 150 may be lower than or higher than the top surfaces of the isolation structures 140.

A gate electrode layer 160 may be deposited over the gate dielectric layer 150. The gate electrode layer 160 may include a conductive material, such as doped poly-crystalline silicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof and/or the like. In some embodiments where the gate electrode layer 160 includes poly-silicon, the gate electrode layer 160 may be formed by depositing doped or undoped poly-silicon by chemical vapor deposition (CVD).

Figure 5:
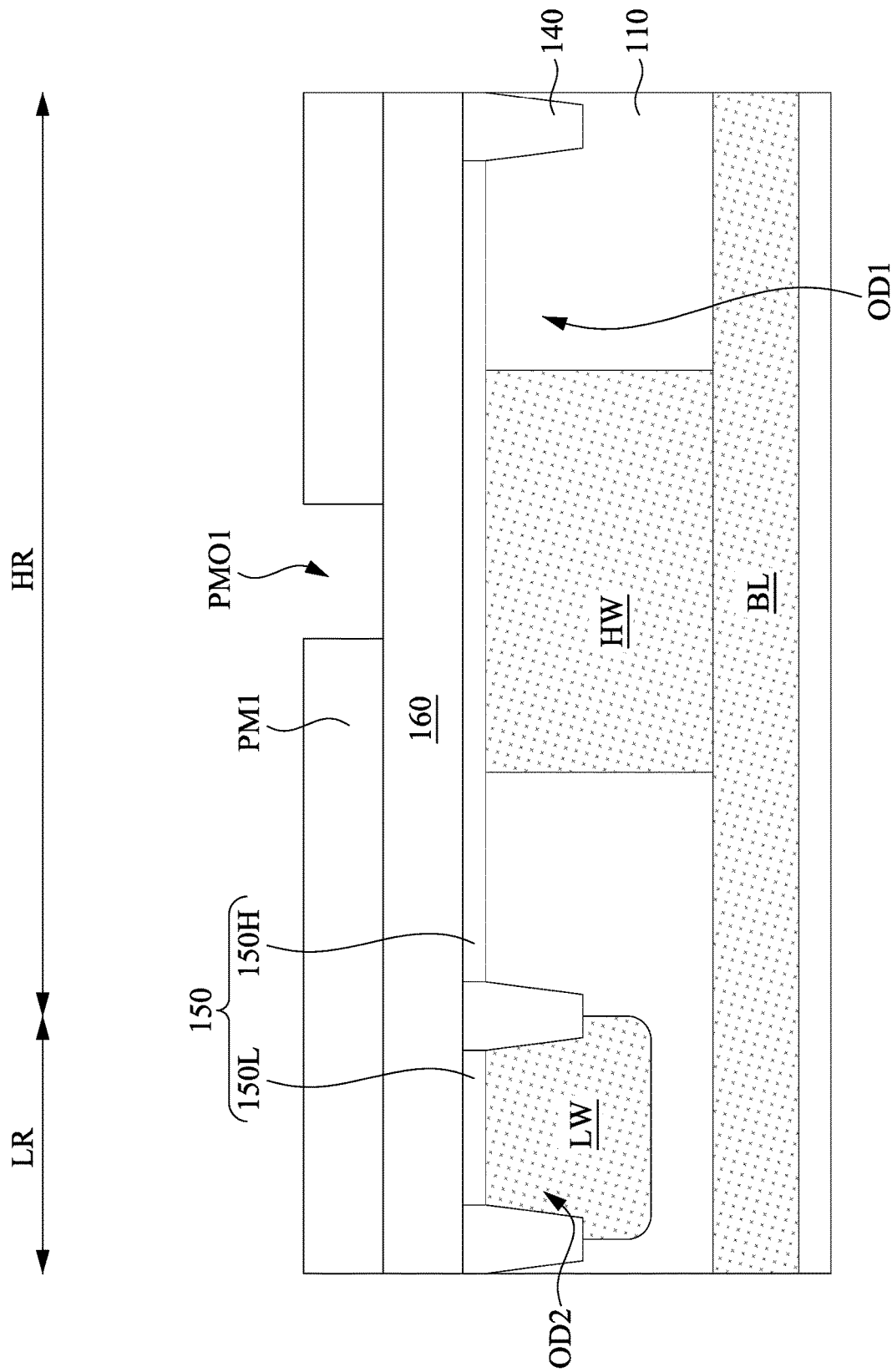

Reference is made to FIG. 5. A patterned mask PM1 is formed over the gate electrode layer 160. In some embodiments, the patterned mask PM1 may be a photoresist mask formed by a photolithography process. For example, the photolithography process may include spin-on coating a photoresist layer over the gate electrode layer 160, exposing the photoresist layer to patterned light, performing a post-exposure bake process, and developing the photoresist layer to form the patterned mask PM1. In some alternative embodiments, the patterned mask PM1 may be a tri-layer resist layer, for example, including a bottom layer (e.g., $C_xH_yO_z$), a middle layer (e.g., $SiC_xH_yO_z$), and a photoresist top layer. The patterned mask PM1 may cover the entire region OD2 and partially covers the region OD1. For example, the patterned mask PM1 covers side portions of the high voltage well region HW but does not cover a middle portion of the high voltage well region HW. In some embodiments, the patterned mask PM1 has an opening PMO1 exposing a portion of the gate electrode layer 160 directly over the middle portion of the high voltage well region HW.

Figure 6:
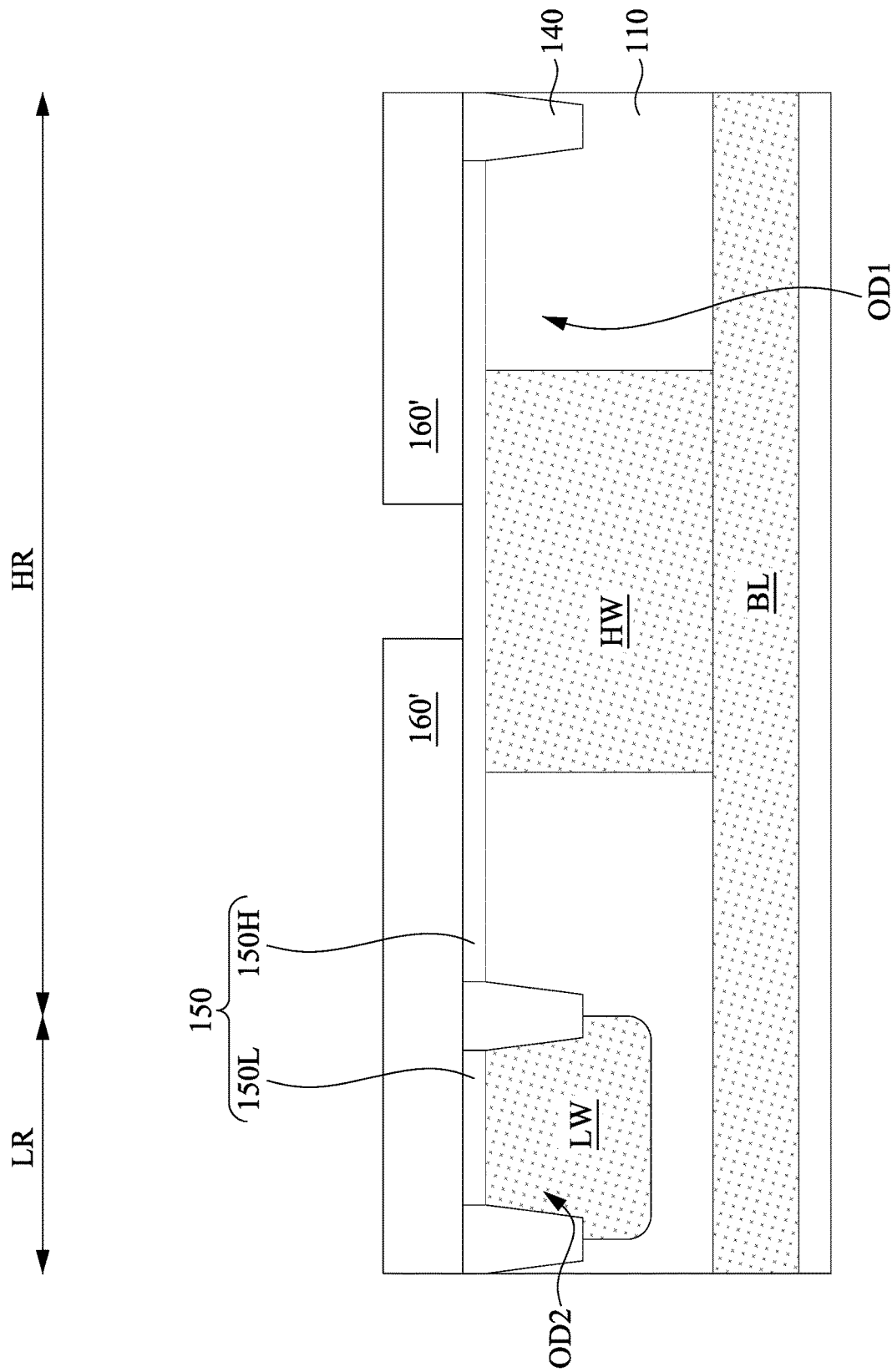

Reference is made to FIG. 6. The gate electrode layer 160 (referring to FIG. 5) is patterned into gate electrode layers 160' by a suitable etching process. The patterned mask PM1 (referring to FIG. 5) may serve as an etch mask during the etching process. The etching process may include dry etch, wet etch, or the combinations thereof. The etching process may use an etchant that shows an etch selectivity between the gate electrode layer 160 (referring to FIG. 5) and the gate dielectric layer 150. For example, the etching process may be a dry etch using gas etchants, such as chloride-based gases, fluoride-based gases, the like, or the combinations thereof. In other words, the gate dielectric layer 150 may have a higher etch resistance to the etchant than that of the gate electrode layer 160 (referring to FIG. 5), and may not be substantially etched by the etchant. Through the etching process, a portion of the gate electrode layer 160 (referring to FIG. 5) exposed by the opening PMO1 of the patterned mask PM1 (referring to FIG. 5) is removed. Remaining portions of the gate electrode layer 160 (referring to FIG. 5) may be referred to gate electrode layers 160' hereinafter. After the etching process, the patterned mask PM1 (referring to FIG. 5) may be removed by a suitable etching/stripping process.

Figure 7:
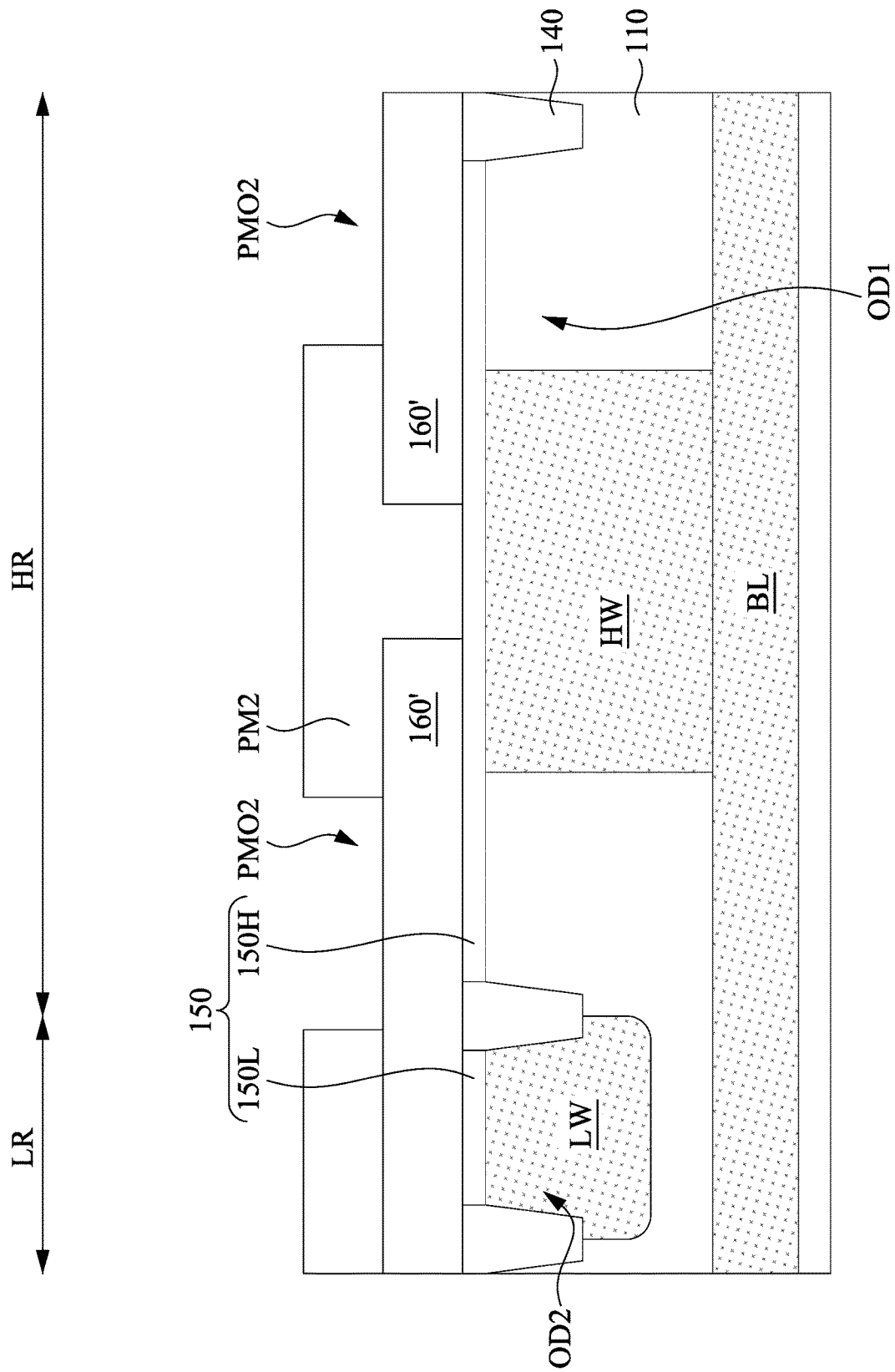

Reference is made to FIG. 7. A patterned mask PM2 is formed over the gate electrode layers 160'. In some embodiments, the patterned mask PM2 may be a photoresist mask formed by a photolithography process. For example, the photolithography process may include spin-on coating a photoresist layer over the gate electrode layers 160', exposing the photoresist layer to patterned light, performing a post-exposure bake process, and developing the photoresist layer to form the patterned mask PM2. In some alternative embodiments, the patterned mask PM2 may be a tri-layer resist layer, for example, including a bottom layer (e.g., $C_xH_yO_z$), a middle layer (e.g., $SiC_xH_yO_z$), and a photoresist top layer. The patterned mask PM2 may cover the entire region OD2 and partially covers the region OD1. For example, the patterned mask PM2 covers the entire high voltage well region HW but does not cover other portions in the region OD1. In some embodiments, the patterned mask PM2 has an opening PMO2 exposing portions in the region OD1 external to the high voltage well region HW.

Figure 8:
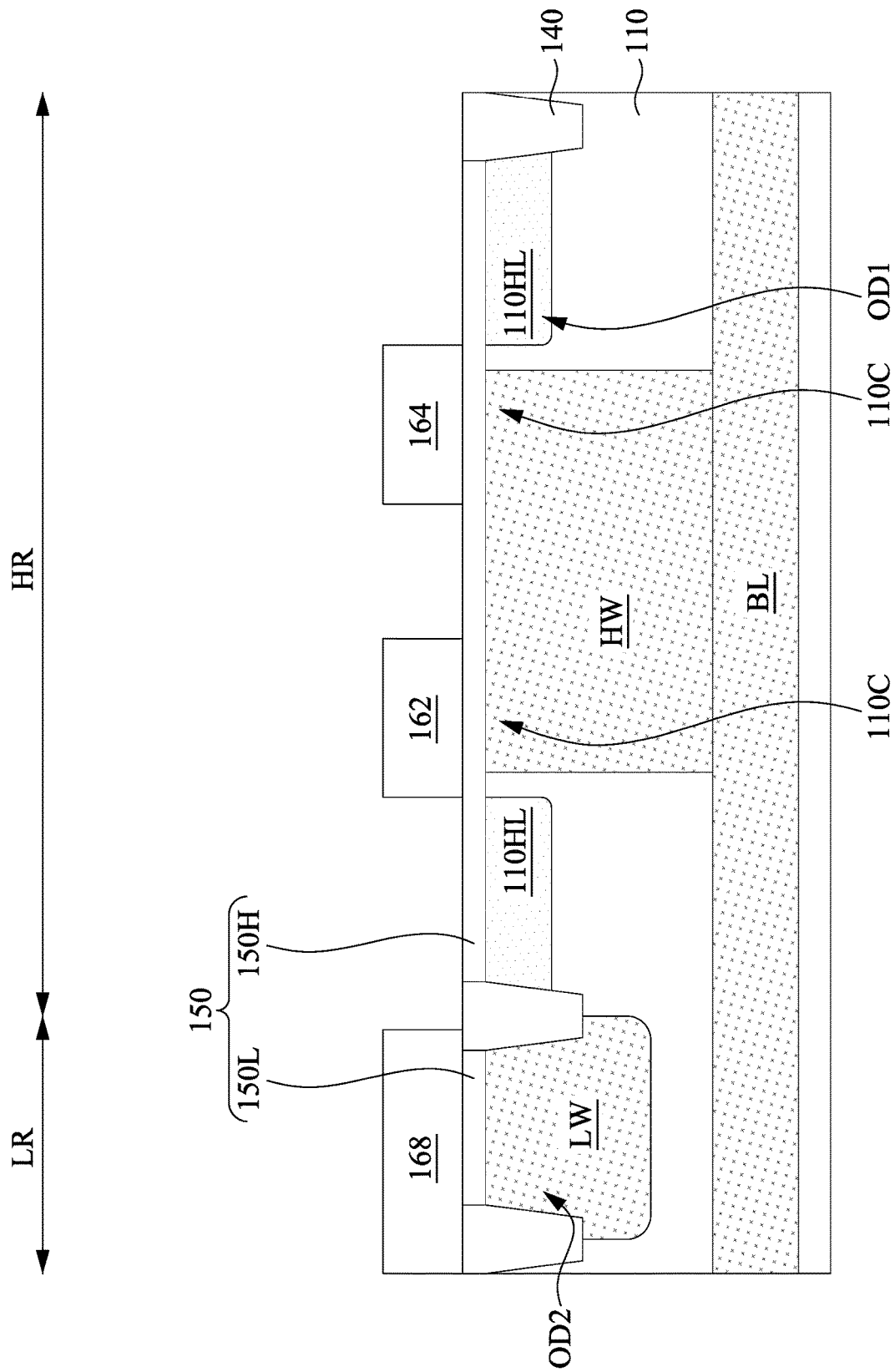

Reference is made to FIG. 8. The gate electrode layers 160' (referring to FIG. 7) is patterned into a gate electrode 162 and a gate electrode 164 over the high voltage region HR, and a dummy gate electrode layer 168 over the logic region LR by a suitable etching process. The patterned mask PM2 (referring to FIG. 7) may serve as an etch mask during the etching process. The etching process may include dry etch, wet etch, or the combinations thereof. The etching process may use an etchant that shows an etch selectivity between the gate electrode layer 160' (referring to FIG. 7) and the gate dielectric layer 150. For example, the etching process may be a dry etch using gas etchants, such as chloride-based gases, fluoride-based gases, the like, or the combinations thereof. In other words, the gate dielectric layer 150 may have a higher etch resistance to the etchant than that of the gate electrode layer 160' (referring to FIG. 7), and may not be substantially etched by the etchant. Through the etching process, a portion of the gate electrode layer 160' (referring to FIG. 7) exposed by the opening PMO2 of the patterned mask PM2 (referring to FIG. 7) is removed. Remaining portions of the gate electrode layer 160' (referring to FIG. 7) may be referred to a gate electrode 162, a gate electrode 164, and a dummy gate electrode layer 168 hereinafter. In some embodiments, the gate electrodes 162 and 164 may vertically overlap portions of the semiconductor substrate 110 (e.g., portions of the high voltage well region HW), which may be referred to channel regions 110C in a resulted device later.

Subsequently, plural lightly doped drain (LDD) regions 110HL are formed in portions of the region OD1 external to the high voltage well region HW through suitable semiconductor doping techniques such as an ion implantation process in some embodiments. The implantation process may be performed with n-type dopants, such as phosphorus, antimony, or arsenic, and/or p-type dopants, such as boron or BF2, depending on design requirements. The patterned mask PM2 (referring to FIG. 7) may serve as an implantation mask in the implantation process. The LDD region 110HL may function as a drift region for the LDMOS device. In some embodiments, the LDD region may be laterally spaced apart from the high voltage well region HW. In some other embodiments, the LDD region neighbors the high voltage well region HW. In some embodiments, for forming the PLDMOS device, the LDD region 110HL may be a p-type region doped with p-type dopants. In some alternative embodiments, for forming the NLDMOS, the LDD region 110HL may be an n-type region doped with n-type dopants. In some embodiments, the doping concentration of the LDD region 110HL is in a range from about $1 \times 10^{13}/cm^3$ to about $1 \times 10^{18}/cm^3$. In some embodiments, the doping concentration of the LDD region 110HL may be higher than that of the high voltage well region HW. By controlling the ion implantation energy, the dopants may penetrate through the top surface of the semiconductor substrate 110, and the depth of the LDD region 110HL may be adjusted accordingly. After the implantation process, the patterned mask PM2 (referring to FIG. 7) may be removed by suitable etching/stripping process.

Figure 9:
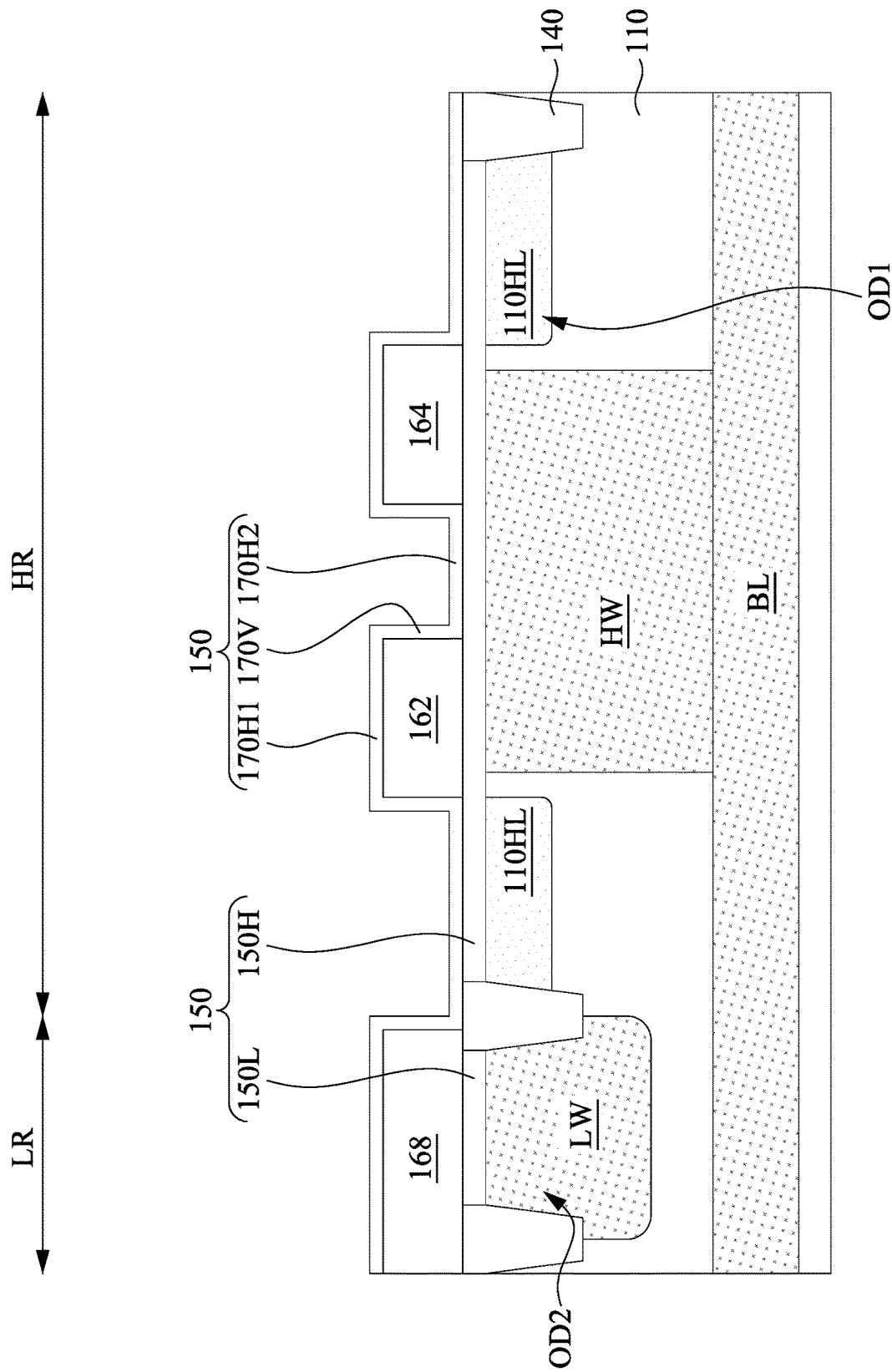

Reference is made to FIG. 9. A dielectric layer 170 is conformably deposited over the structure of FIG. 8. The dielectric layer 170 may be formed of a suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. In some embodiments, the dielectric layer 170 may be formed by a CVD process (e.g., high temperature oxide deposition (HTO) process) with rapid thermal annealing (RTA). In some embodiments, the formation of the dielectric layer 170 does not substantially include a thermal oxidation process. The dielectric layer 170 may have portions 170V alongside sidewalls of the gate electrodes 162 and 164, portions 170H1 over top surfaces of the gate electrodes 162 and 164, and portions 170H2 over a top surface of the substrate 110 and extending along the top surface of the gate dielectric layer 150 and the top surfaces of the isolation structures 140. In some embodiments, the dielectric layer 170 may have a thickness in a range from about 100 angstroms to about 3000 angstroms. If the thickness of the dielectric layer 170 is greater than about 3000 angstroms, the on-resistance ($R_{dson}$) may be large, and a factor of merit (FOM) of a formed BCD device may become too high. If the thickness T1 of the dielectric layer 170 is less than about 100 angstroms, the dielectric layer 170 may breakdown when high voltages are applied.

Figure 10:
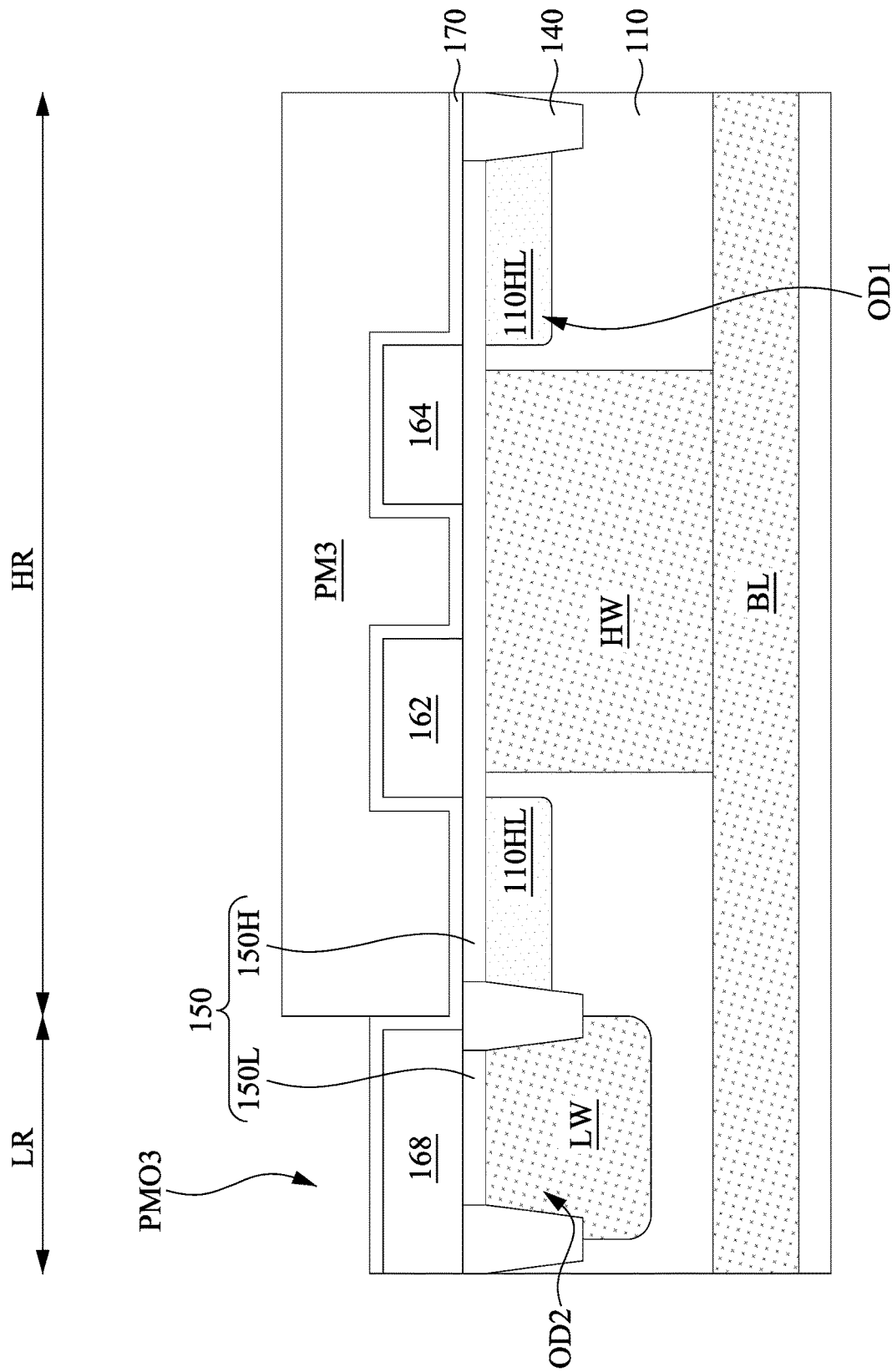

Reference is made to FIG. 10. A patterned mask PM3 is formed over the dielectric layer 170. In some embodiments, the patterned mask PM3 may be a photoresist mask formed by a photolithography process. For example, the photolithography process may include spin-on coating a photoresist layer over the dielectric layer 170, exposing the photoresist layer to patterned light, performing a post-exposure bake process, and developing the photoresist layer to form the patterned mask PM3. In some alternative embodiments, the patterned mask PM3 may be a tri-layer resist layer, for example, including a bottom layer (e.g., $C_xH_yO_z$), a middle layer (e.g., $SiC_xH_yO_z$), and a photoresist top layer. The patterned mask PM3 may cover the region OD1 and has an opening PMO3 exposing the region OD2.

Figure 11:
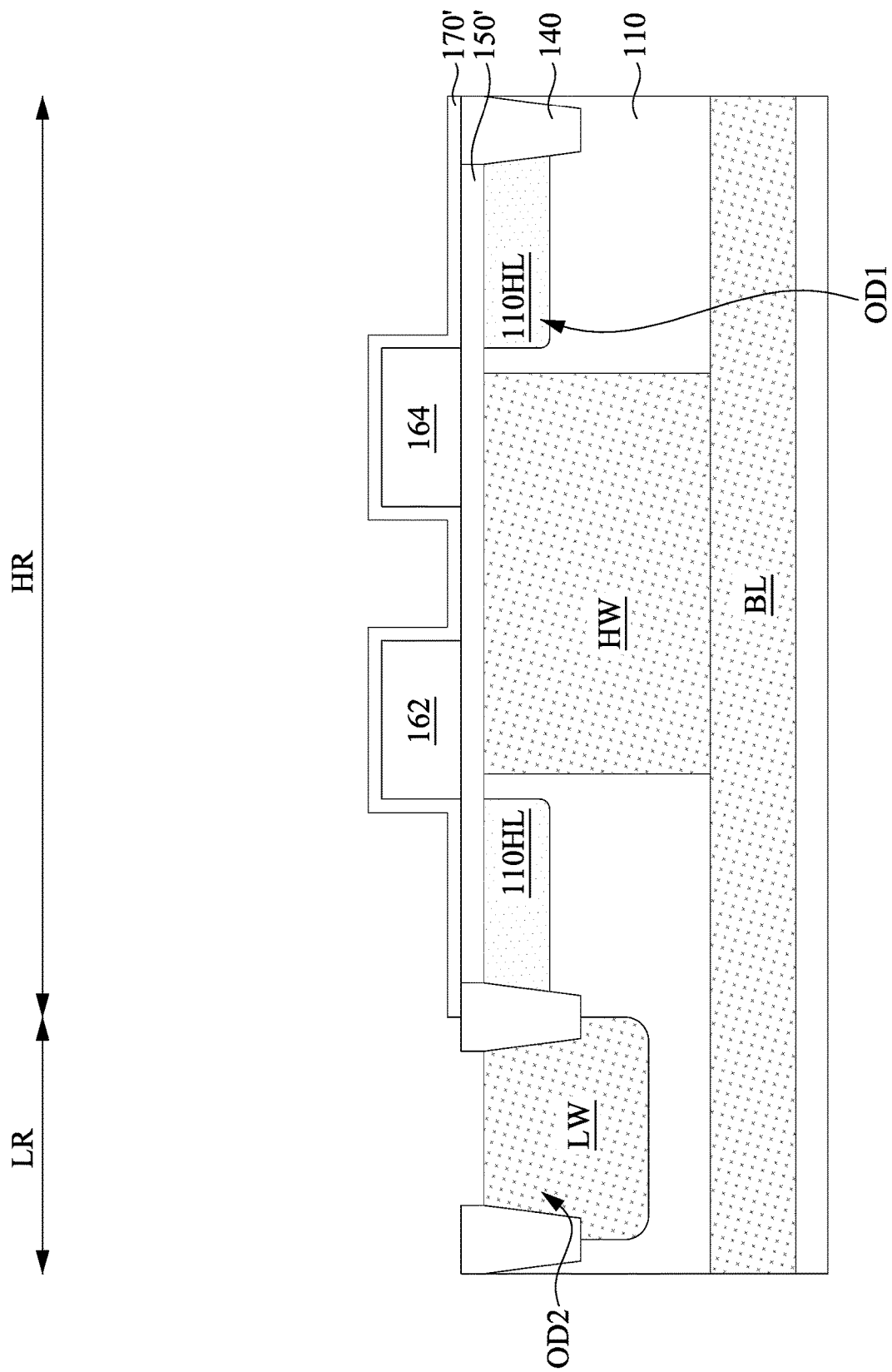

Reference is made to FIG. 11. The portion of the dielectric layer 170 over the region OD2, the dummy gate electrode layer 168, and the portion 150L of the gate dielectric layer 150 (referring to FIG. 10) are removed by a suitable etching process. The patterned mask PM3 may serve as an etch mask during the etching process. After the etching process, a top surface of the region OD2 may be exposed, and the remaining portion of the dielectric layer 170 and the remaining portion 150H1 of the gate dielectric layer 150 (referring to FIG. 10) over the region OD1 are referred to as a dielectric layer 170' and a gate dielectric layer 150' respectively hereinafter.

In some embodiments, the removal may include a first etching process, a second etching process, and a third etching process. The first to third etching processes may include a dry etching process, a wet etching process, or combinations thereof. The first etching process may be performed to remove the portion of the dielectric layer 170 (referring to FIG. 10) over the region OD2. The first etching process may use a first etchant that shows an etch selectivity between the dielectric layer 170 and the gate electrode 168 (referring to FIG. 10), and may not substantially etch the gate electrode 168 (referring to FIG. 10). After removing the portion of the dielectric layer 170 (referring to FIG. 10) over the region OD2, the second etching process may be performed to remove the gate electrode 168 (referring to FIG. 10). The second etching process may use a second etchant that shows an etch selectivity between the gate electrode 168 and the gate dielectric layer 150 (referring to FIG. 10), and may not substantially etch the portion 150L of the gate dielectric layer 150 (referring to FIG. 10). After removing the gate electrode 168 (referring to FIG. 10), the third etching process may be performed to remove the portion 150L of the gate dielectric layer 150 (referring to FIG. 10). The third etching process may use a third etchant that shows an etch selectivity between the gate dielectric layer 150 (referring to FIG. 10) and the substrate 110, and may not substantially etch the substrate 110. After the etching processes, the patterned mask PM3 (referring to FIG. 10) may be removed by a suitable etching/stripping process.

Figure 12:
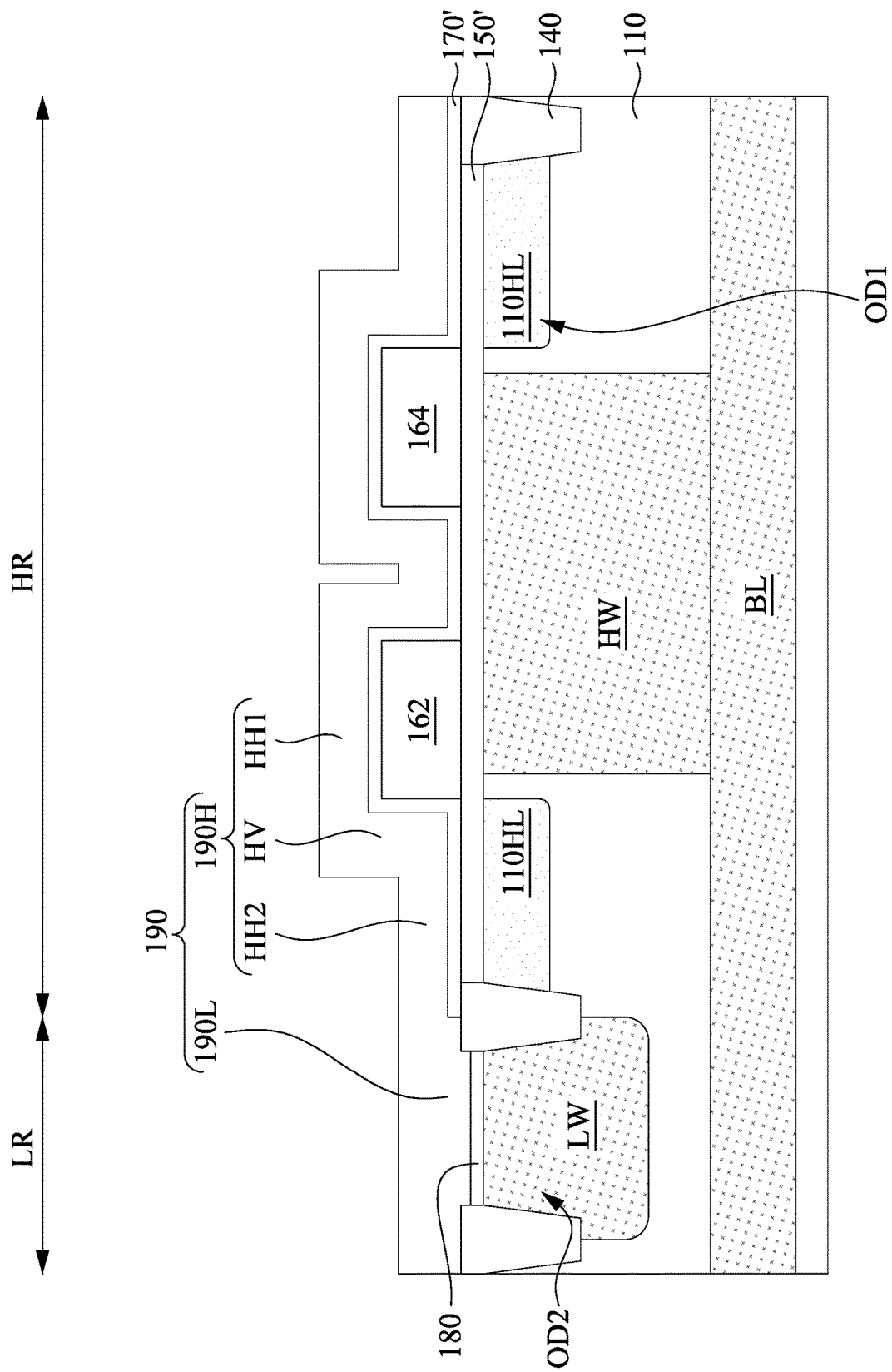

Reference is made to FIG. 12. A gate dielectric layer 180 may be formed over the exposed region OD2. The gate dielectric layer 180 may be formed of a suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. In some embodiments where the gate dielectric layer 180 includes oxides, the gate dielectric layer 180 may be formed by a thermal oxidation process, other suitable deposition methods, or the like. In some embodiments, the formation of the gate dielectric layer 180 may also form a thin layer over a top surface of the dielectric layer 170'.

A gate electrode layer 190 may be subsequently formed over the dielectric layer 170' and the gate dielectric layer 180. The gate electrode layer 190 may include a conductive material, such as doped poly-crystalline silicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof and/or the like. In some embodiments, the gate electrode layer 190 may be formed by depositing doped or undoped poly-silicon by CVD. The gate electrode layer 190 may have a portion 190H over the region OD1 and a portion 190L over the region OD2. The portion 190H may have vertical portions HV alongside the gate electrodes 162 and 164, horizontal portions HH1 over the top surfaces of the gate electrodes 162 and 164 extending laterally from tops of the vertical portions HV, and horizontal portions HH2 at a position lower than the horizontal portions HH1 and extending laterally from bottoms of the vertical portions HV.

Figure 13:
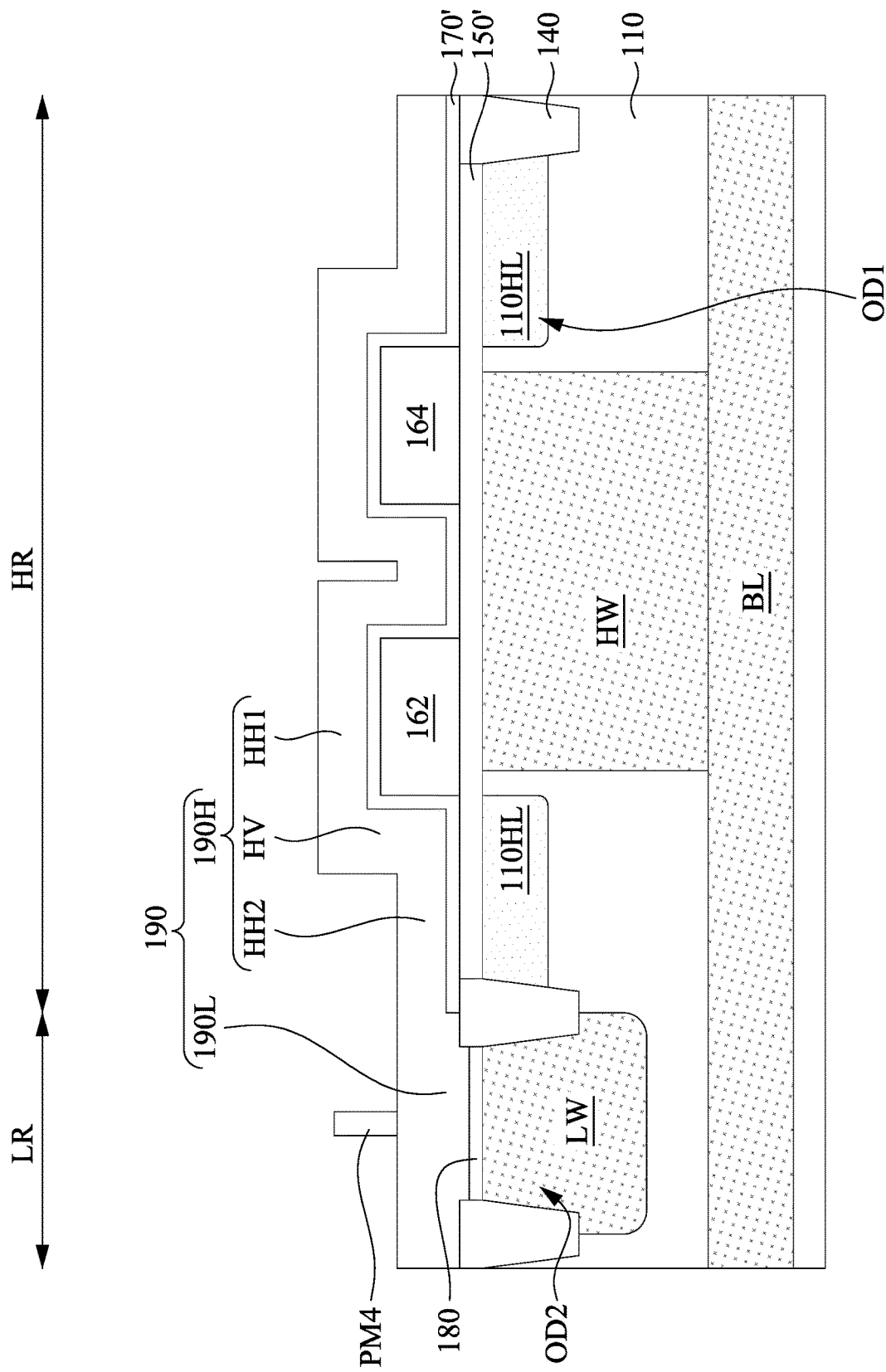

Reference is made to FIG. 13. A patterned mask PM4 is formed over the portion 190L of the gate electrode layer 190. In some embodiments, the patterned mask PM4 may be a photoresist mask formed by a photolithography process. For example, the photolithography process may include spin-on coating a photoresist layer over the gate electrode layer 190, exposing the photoresist layer to patterned light, performing post-exposure bake processes, and developing the photoresist layer to form the patterned mask PM4. In some alternative embodiments, the patterned mask PM4 may be tri-layer resist layer, for example, including a bottom layer (e.g., $C_xH_yO_z$), a middle layer (e.g., $SiC_xH_yO_z$), and a photoresist top layer. The patterned mask PM4 may expose the entire region OD1 and covers a portion of the region OD2.

Figure 14:
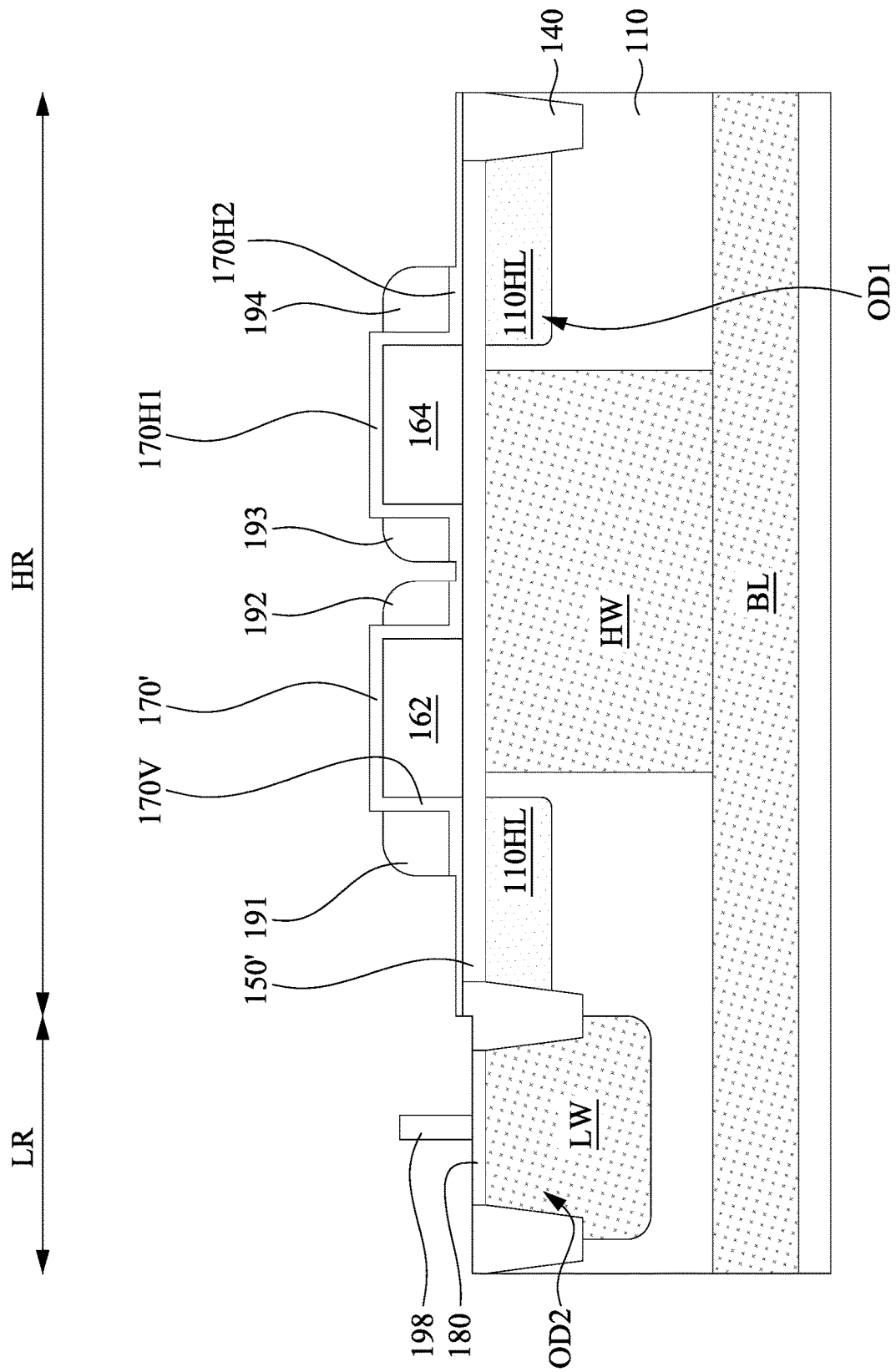

Reference is made to FIG. 14. The gate electrode layer 190 (referring to FIG. 13) is patterned into field plate electrodes 191-194 and a logic gate electrode 198 by a suitable anisotropic etching process. The patterned mask PM4 (referring to FIG. 13) may serve as an etch mask during the etching process. The etching processes may include an anisotropic dry etch using an etchant that shows an etch selectivity between the gate electrode layer 190 (referring to FIG. 13) and the underlying dielectric materials (e.g., the dielectric layer 170', the gate dielectric layer 180, and the isolation structures 140). For example, the etching process may use gas etchants, such as chloride-based gases, fluoride-based gases, the like, or the combinations thereof. In other words, the underlying dielectric materials (e.g., the dielectric layer 170', the gate dielectric layer 180, and the isolation structures 140) may have a higher etch resistance to the etchant than that of the gate electrode layer 190 (referring to FIG. 13). In some embodiments, the etching process may not substantially etch the underlying dielectric materials (e.g., the dielectric layer 170', the gate dielectric layer 180, and the isolation structures 140). In some embodiments, the etching process may consume a portion of the underlying dielectric materials (e.g., the dielectric layer 170', the gate dielectric layer 180, and the isolation structures 140). For example, a portion of the dielectric layer 170' uncovered by the field plate electrodes 191-194 may be thinned by the etching process.

In some embodiments, in the high voltage region HR, the anisotropic dry etch is performed such that horizontal portions HH1 and HH2 of the portion 190H of the gate electrode layer 190 (referring to FIG. 13) are removed, and vertical portions HV of the portion 190H of the gate electrode layer 190 (referring to FIG. 13) remains. The remaining vertical portions HV of the portion 190H of the gate electrode layer 190 (referring to FIG. 13) may be referred to the field plate electrodes 191-194 hereinafter. In some embodiments, the field plate electrodes 191-194 are alongside the portions 170V of the dielectric layer 170' and over the portions 170H2 of the dielectric layer 170'. In some embodiments, a bottom surface of the field plate electrodes 191-194 is higher than a bottom surface of the gate electrodes 162 and 164.

In some embodiments of the present disclosure, as the anisotropic dry etch is performed without masking any portions of the gate electrode layer 190 (referring to FIG. 13) in the high voltage region HR, the field plate electrodes 191-194 are formed in a self-align manner. In some embodiments, the field plate electrodes 191-194 are formed on opposite sidewalls of the gate electrodes 162 and 164, and taper away from the gate electrodes 162 and 164. For example, a top surface of at least one of the field plate electrodes 191-194 has first and second ends, the gate electrode 162/164 is closer to the first end than the second end, and the first end of the top surface of said one of the field plate electrodes 191-194 is higher than the second end of the top surface of said one of the field plate electrodes 191-194. In some embodiments, the field plate electrodes 192 and 193 may be referred to as dummy field plate electrodes, which is removed in subsequent process.

In some embodiments, in the logic region LR, parts of the portion 190L of the gate electrode layer 190 (referring to FIG. 13) exposed by the patterned mask PM4 (referring to FIG. 13) are removed. A part of the portion 190L of the gate electrode layer 190 (referring to FIG. 13) protected by the patterned mask PM4 (referring to FIG. 13) may remain intact and be referred to the logic gate electrode 198 hereinafter. For logic circuit applications, the logic gate electrode 198 in the logic region LR may have a width less than a width of the gate electrodes 162 and 164 in the high voltage region HR. After the etching process, the patterned mask PM4 (referring to FIG. 13) may be removed by a suitable etching/stripping process.

Figure 15:
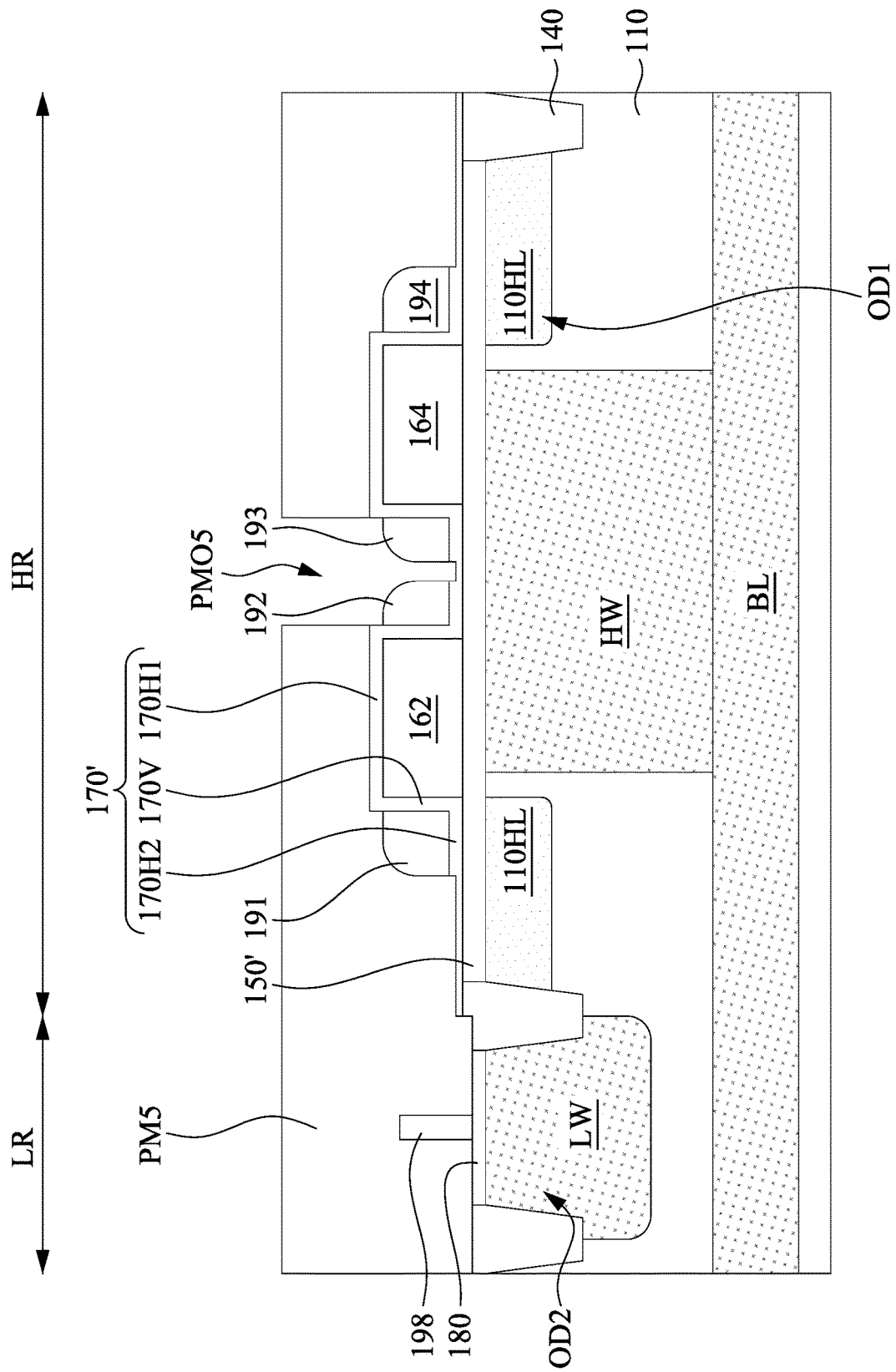

Reference is made to FIG. 15. A patterned mask PM5 is formed over the structure of FIG. 14. In some embodiments, the patterned mask PM5 may be a photoresist mask formed by a photolithography process. For example, the photolithography process may include spin-on coating a photoresist layer over the structure of FIG. 14, exposing the photoresist layer to patterned light, performing post-exposure bake processes, and developing the photoresist layer to form the patterned mask PM5. In some alternative embodiments, the patterned mask PM5 may be a tri-layer resist layer, for example, including a bottom layer (e.g., $C_xH_yO_z$), a middle layer (e.g., $SiC_xH_yO_z$), and a photoresist top layer. The patterned mask PM5 may cover the field plate electrodes 191 and 194 and the logic gate electrode 198, and have an opening PMO5 exposing the field plate electrodes 192 and 193.

Figure 16:
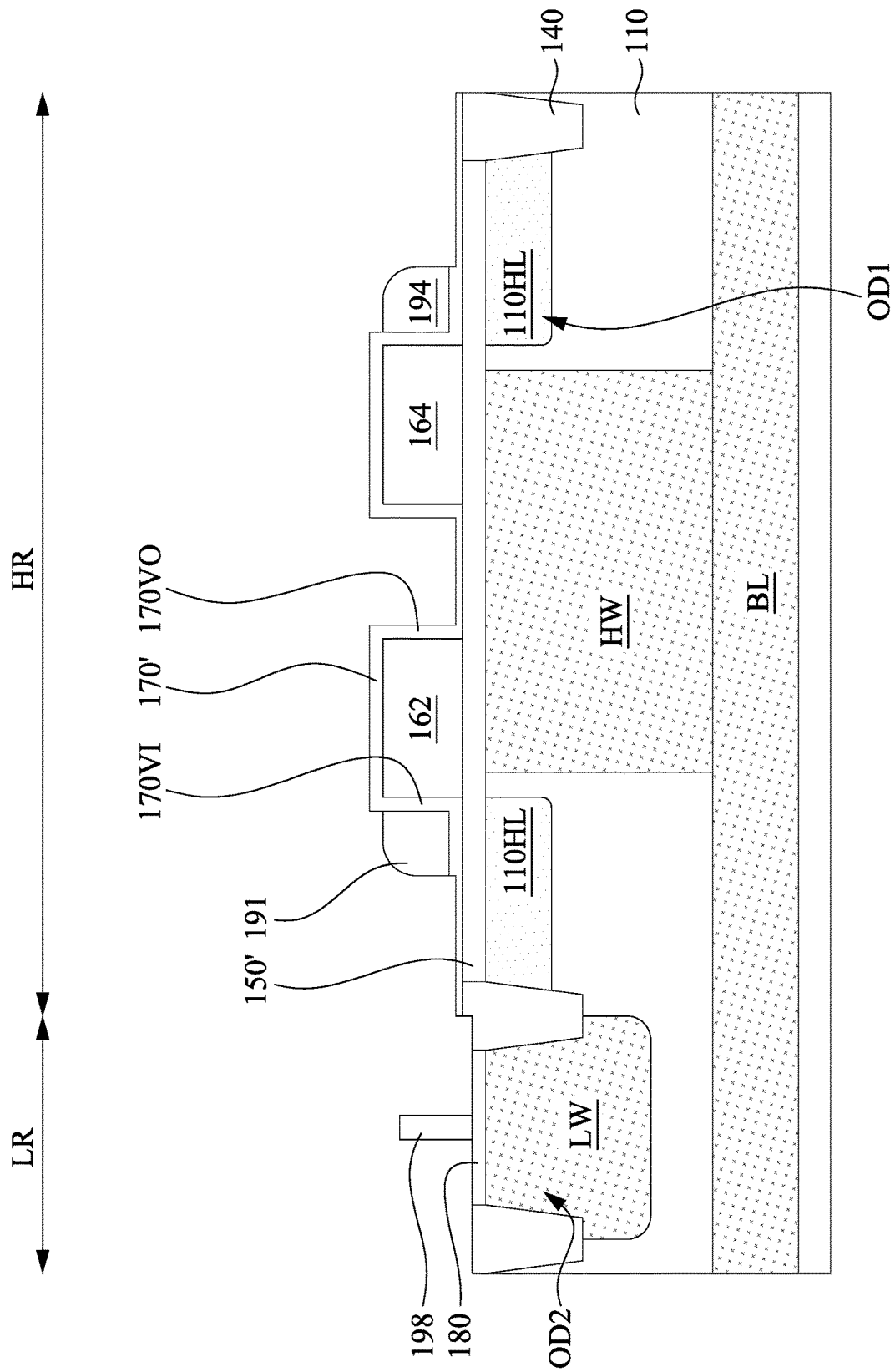

Reference is made to FIG. 16. An etching process is performed to remove the field plate electrodes 192 and 193 (referring to FIG. 15). The patterned mask PM5 (referring to FIG. 15) may serve as an etch mask during the etching process. The etching processes may include a dry etch, a wet etch, or the combinations thereof. The etching processes may be a dry etch using an etchant that shows an etch selectivity between the field plate electrodes 192 and 193 (referring to FIG. 15) and the dielectric layer 170'. For example, the etching process may use gas etchants, such as chloride-based gases, fluoride-based gases the like, or the combinations thereof. In other words, the dielectric layer 170' may have a higher etch resistance to the etchant than that of the field plate electrodes 192 and 193 (referring to FIG. 15), and serve as an etch stop layer during the etching process. After the etching process, some of the portions 170V of the dielectric layer 170' (referring to FIG. 15) may remain between the gate electrode 162/164 and the field plate electrode 191/194, and be referred to as inter dielectric portions 170VI hereinafter. On the other hand, some of the portions 170V of the dielectric layer 170' (referring to FIG. 15) may remain on a side of the gate electrode 162/164 facing away from the field plate electrode 191/194, and be referred to as dielectric portions 170VO. After the etching process, the patterned mask PM5 (referring to FIG. 15) may be removed by a suitable etching/stripping process.

Figure 17:
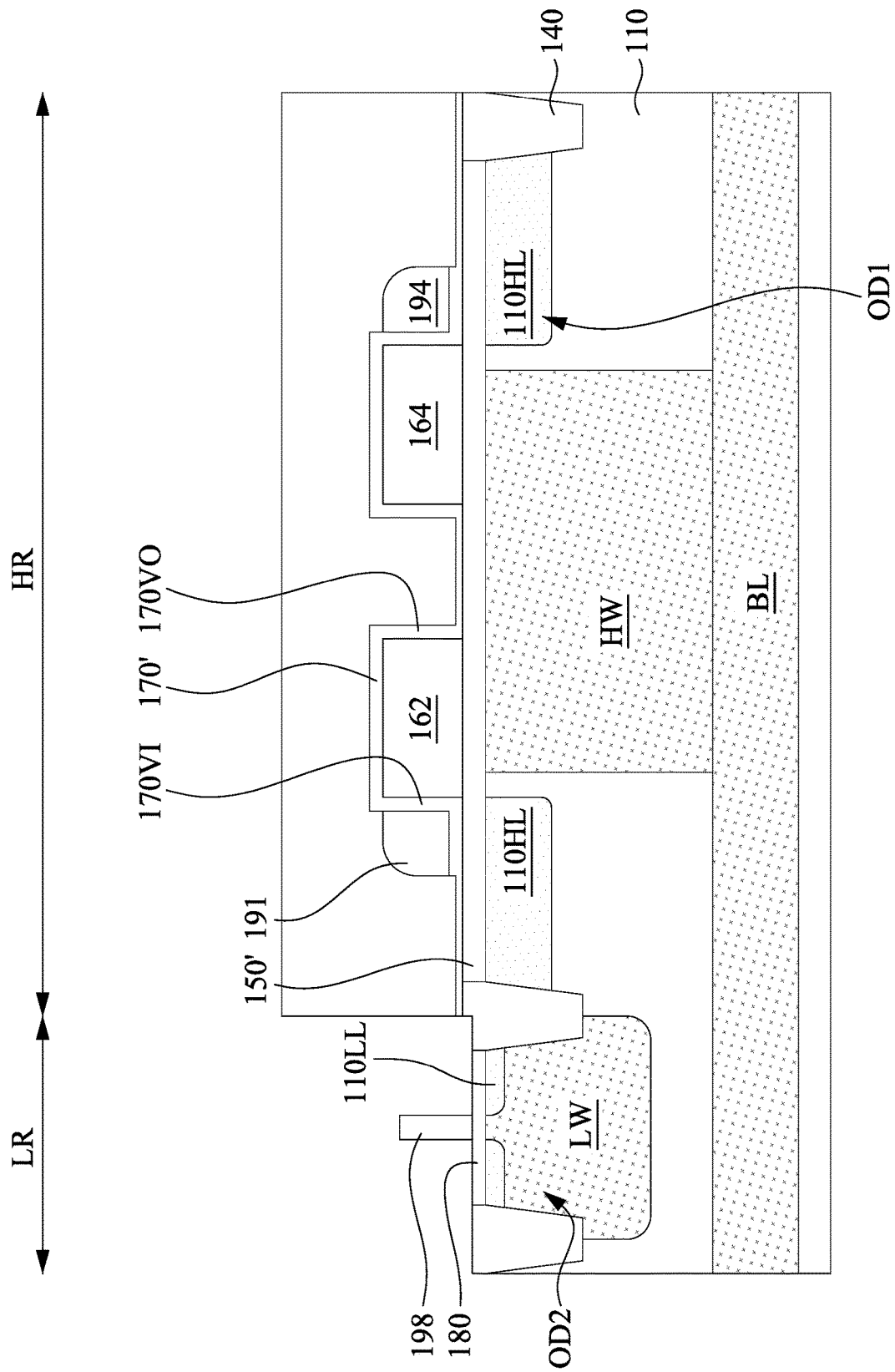

Reference is made to FIG. 17. Plural lightly doped drain (LDD) regions 110LL are formed in the region OD2 in the substrate 110 through suitable semiconductor doping techniques such as an ion implantation process in some embodiments. The implantation process may be performed with n-type dopants, such as phosphorus, antimony, or arsenic, and/or p-type dopants, such as boron or $BF_2$, depending on design requirements. In some embodiments, the doping concentration of the LDD region 110LL is in a range from about $1\times10^{13}/cm^3$ to about $1\times10^{18}/cm^3$. In some embodiments, the doping concentration of the LDD region 110LL may be higher than that of the logic well region LW. By controlling the ion implantation energy, the dopants may penetrate through the top surface of the semiconductor substrate 110, and the depth of the LDD region 110LL may be adjusted accordingly.

In some embodiments, prior to forming the LDD region 110LL in the region OD2, a patterned mask PM6 is formed to cover the region OD1 and expose the region OD2. The patterned mask PM6 may be a photoresist mask formed by a photolithography process. For example, the photolithography process may include spin-on coating a photoresist layer over the structure of FIG. 16, exposing the photoresist layer to patterned light, performing a post-exposure bake process, and developing the photoresist layer to form the patterned mask PM6. In some alternative embodiments, the patterned mask PM6 may be a tri-layer resist layer, for example, including a bottom layer (e.g., CxHyOz), a middle layer (e.g., SiCxHyOz), and a photoresist top layer. The patterned mask PM6 may protect the region OD1 from the ion implantation during forming the LDD region 110LL. After forming the LDD region 110LL, the patterned mask PM6 is removed by a suitable stripping process (etching and/or cleaning). The stripping process may also consume a portion of the dielectric layer 170'. For example, a portion of the dielectric layer 170' uncovered by the field plate electrodes 191-194 may be thinned after removing the patterned mask PM6.

Figure 18:
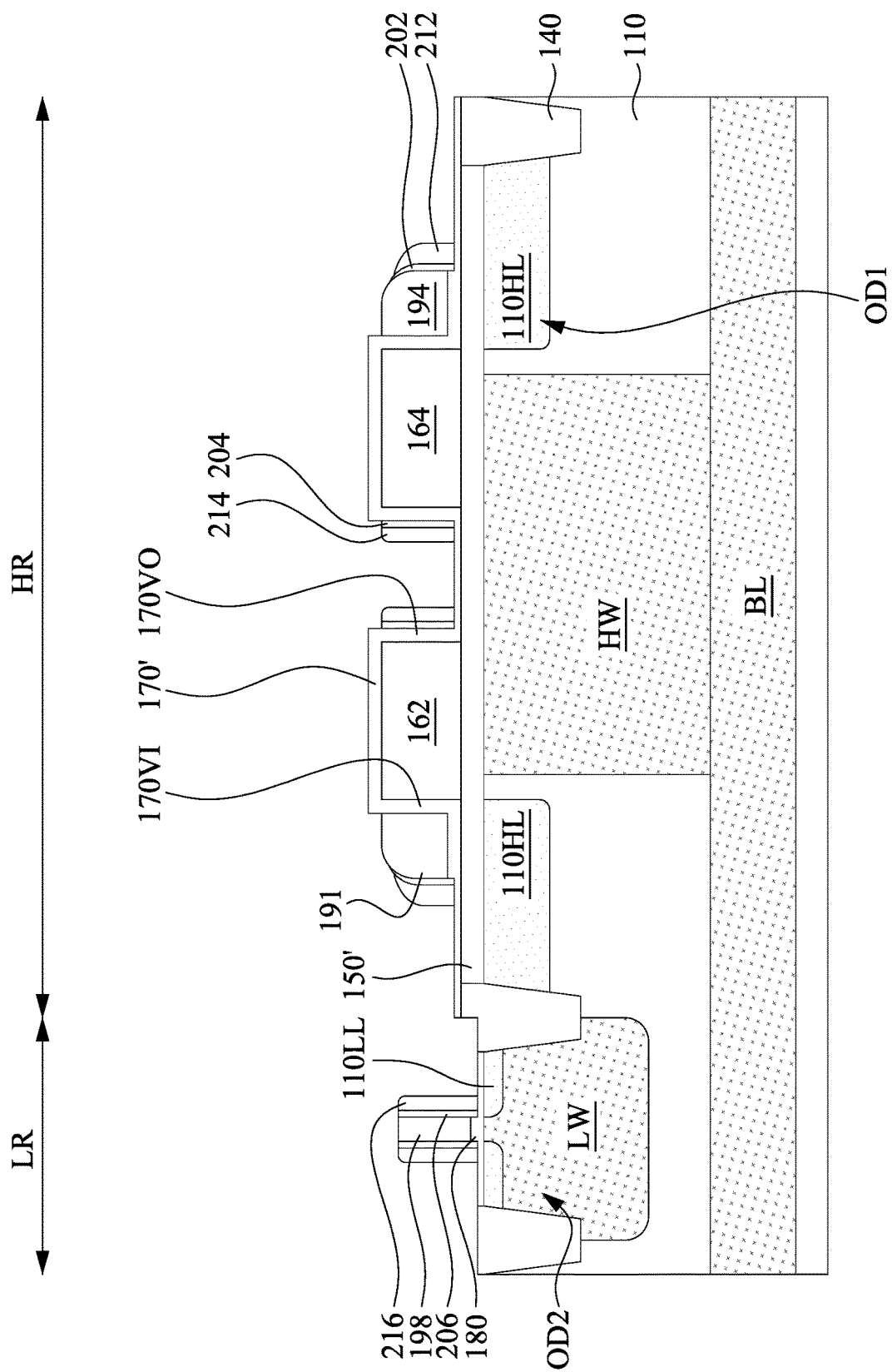

Reference is made to FIG. 18. Plural offset sidewall spacers 202-206 and plural spacers 212-216 are formed. In some embodiments, in the high voltage region HR, the offset sidewall spacers 202 and the spacers 212 are formed alongside exposed sidewalls of the field plate electrode 191 and 194, and the offset sidewall spacers 204 and the spacers 214 are formed alongside exposed sidewalls of the dielectric layer 170'. In other words, the offset sidewall spacers 202 and the spacers 212 are formed alongside a sidewall of the field plate electrode 191/194 facing away from the portion 170VI of the dielectric layer 170, and the offset sidewall spacers 202 and the spacers 212 are formed alongside a sidewall of the portion 170VO of the dielectric layer 170 facing away from the gate electrode 162/164. The offset sidewall spacers 202 and the spacers 212 may be over the gate dielectric layer 150'. In the logic region LR, the offset sidewall spacers 206 and the plural spacers 216 are formed on exposed opposite sidewalls of the logic gate electrode 198. The offset sidewall spacers 202-206 and the spacers 212-216 may offset source/drain region formed in subsequent process.

The offset sidewall spacers 202-206 may include suitable dielectric materials such as SiN, oxynitride, SiC, SiON, oxide and/or the like. The offset sidewall spacers 202-206 may be formed by blanket depositing one or more offset sidewall spacer layers over the structure of FIG. 17, and patterning the offset sidewall spacer layer by a suitable anisotropic etching process. The deposition of the offset sidewall spacer layer may include ALD, CVD, the like, or the combinations thereof.

In the present embodiments, the offset sidewall spacers 202-206 are formed after the formation of LDD region 110LL. In some other embodiments, the offset sidewall spacers 202-206 are formed prior to the formation of LDD region 110LL, and thus the offset sidewall spacers 206 offset edges of the LDD region 110LL.

The spacers 212-216 may include suitable dielectric materials such as SiN, oxynitride, SiC, SiON, oxide and/or the like. The spacers 212-216 may be formed by blanket depositing one or more spacer layers over the offset sidewall spacers 202-206, the dielectric layer 170, the field plate electrode 191 and 194, and the logic gate electrode 198, and patterning the spacer layer by a suitable anisotropic etching process. The deposition of the spacer layer may include ALD, CVD, the like, or the combinations thereof. In some other embodiments, the spacers 212-216 and the offset sidewall spacers 202-206 may include different materials. For example, the offset sidewall spacers 202-206 include oxides, and the spacers 212-216 include nitrides.

Figure 19:
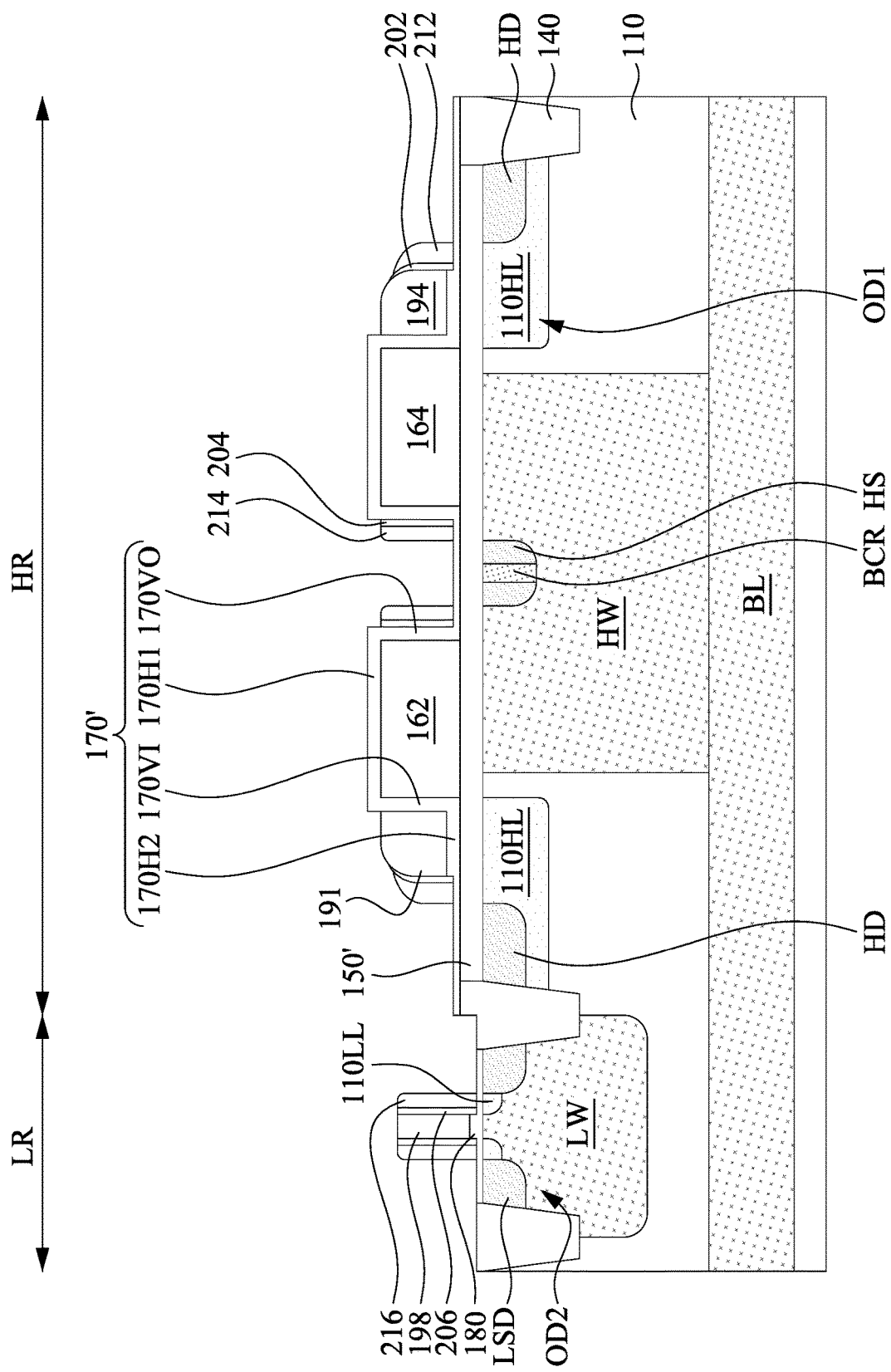

Reference is made to FIG. 19. Through suitable semiconductor doping techniques such as an ion implantation process, drain regions HD, source regions HS, and a body contact region BCR are formed in the region OD1, and source/drain regions LSD are formed in the region OD2. For example, the source regions HS is formed in the well region HW, and the drain regions HD is formed in semiconductor substrate 110, in which a portion of the LDD region 110HL (e.g., drift region) is disposed laterally between the second source regions HS and the channel region 110C (the portion of the substrate 110 below the gate electrode 162/164). The implantation process may be performed with n-type dopants, such as phosphorus, antimony, or arsenic, and/or p-type dopants, such as boron or $BF_2$, depending on design requirements. In some embodiments, the source/drain regions LSD, the drain regions HD, and the source regions HS are first doped in the substrate 110, and then the body contact region BCR is doped later in the high voltage well region HW, or vice versa. The source/drain regions LSD, the drain regions HD, and the source regions HS can be heavily doped regions that are configured to receive a top contact structure and form a conductive connection with interconnect metallization. In some embodiments, the doping concentrations of the source/drain regions LSD, the drain regions HD, and the source regions HS may be in a range from about $1\times10^{13}/cm^3$ to about $1\times10^{22}/cm^3$. In some embodiments, the doping concentrations of the source/drain regions LSD, the drain regions HD, and the source regions HS may be higher than that of the LDD regions 110HL and 110LL. The body contact region BCR can be heavily doped regions that are configured to receive a top contact structure that provides conductive connection between interconnect metallization and the high voltage well region HW. In some embodiments, the doping concentration of the body contact region BCR may be in a range from about $1\times10^{13}/cm^3$ to about $1\times10^{22}/cm^3$. In some embodiments, the doping concentrations of the body contact region BCR may be higher than that of the LDD regions 110HL. By controlling the ion implantation energy, the dopants may penetrate through the top surface of the semiconductor substrate 110. The depths of the source/drain regions LSD, the drain regions HD, the source regions HS, and the body contact region BCR may be adjusted accordingly. In some embodiments, with a portion of the dielectric layer 170' filling between the gate electrode 162/164 and the field plate electrode 191/194, a region in the substrate 110 between the gate electrode 162/164 and the field plate electrode 191/194 can be protected from SID implant shoot through.

In the present embodiments, for forming PLDMOS, the drain regions HD and the source regions HS are p-typed doped regions doped with p-type dopants, and the body contact region BCR is an n-type doped region doped with n-type dopants. In the present embodiments, the source/drain regions LSD may be p-typed doped regions doped with p-type dopants. In some alternative embodiments, for forming NLDMOS, the drain regions HD and the source region HS are n-typed doped regions doped with n-type dopants, and the body contact region BCR is a p-type doped region doped with p-type dopants. In some embodiments, the drain regions HD, the source regions HS, and the source/drain regions LSD may be referred to as source/drain features, and the body contact region BCR may be referred to as a body contact feature.

Figure 20A:
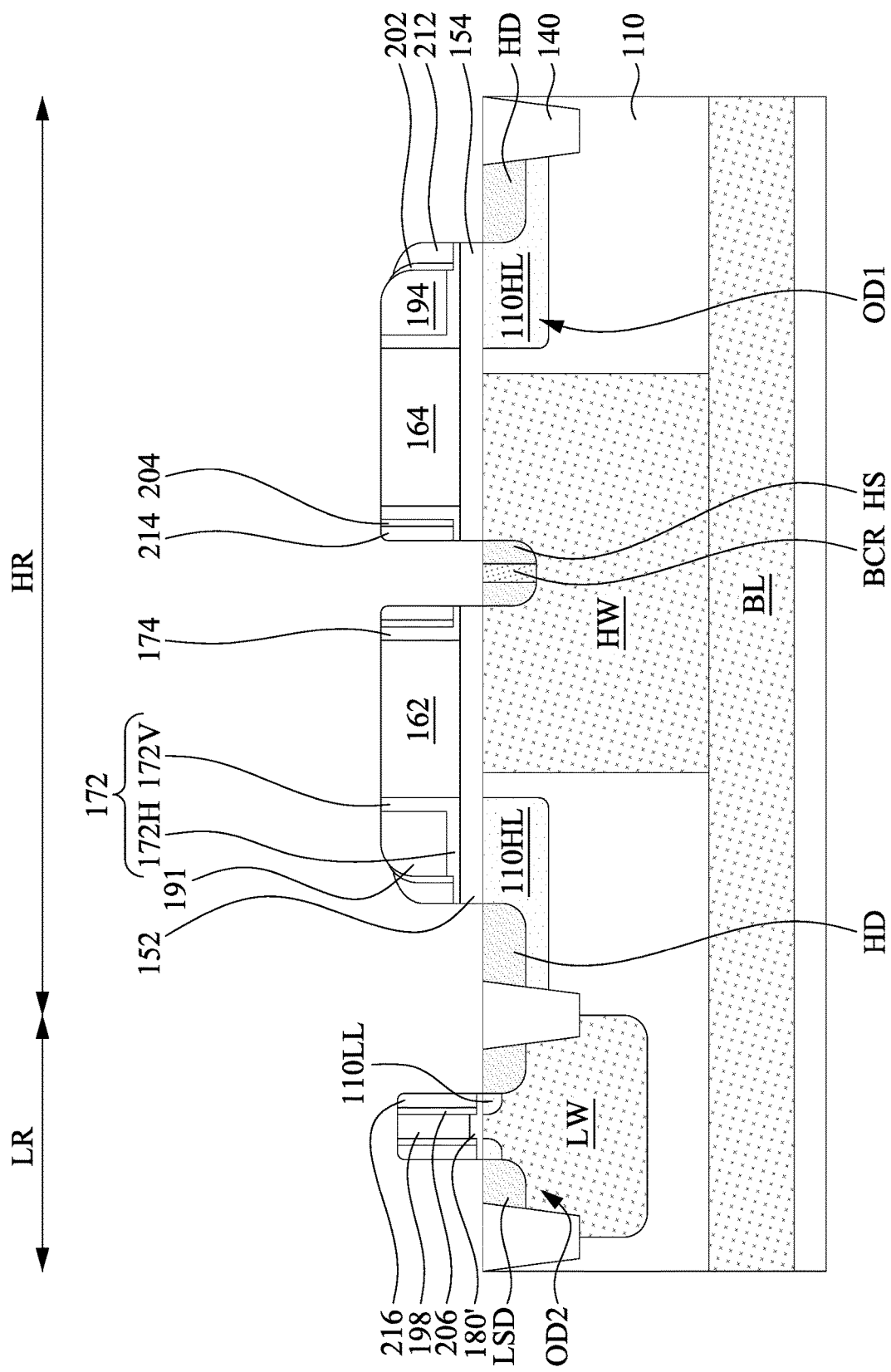

Reference is made to FIG. 20A. An etching process is performed to pattern the gate dielectric layer 180, the dielectric layer 170', and the gate dielectric layer 150' (referring to FIG. 19). For example, the etching process is performed to remove the portions of the gate dielectric layer 180, the dielectric layer 170' (e.g., the portion 170H1 and 170H2), and the gate dielectric layer 150' that are not covered by the gate electrodes 162, 164, and 198, the field plate electrodes 191 and 194, the offset sidewall spacers 202-206, and the spacers 212-216. For example, the portions 170H1 of the dielectric layer 170' (referring to FIG. 19) is removed from the top surface of the gate electrode 162/164. The etching process may be a dry etch, a wet etch, the like, or the combination thereof. For example, the etching process may use gas etchants for etching an oxide material. In some embodiments, the silicon material (e.g., the substrate 110 and the logic gate electrode 198, the gate electrodes 162 and 164, and the field plate electrodes 191 and 194) and the spacer material (e.g., the offset sidewall spacers 202-206 and the spacers 212-216) have a higher etch resistance to the etching process than that of the gate dielectric layer 180, the dielectric layer 170', the gate dielectric layer 150', and may not be substantially etched by the etching process. After the etching process, a top surface of the semiconductor substrate 110 and top surfaces of the gate electrodes 162 and 164 are exposed. For example, top sides of the source/drain regions LSD, the drain region HD, the source region HS, and the body contact region BCR are exposed.

In some embodiments, through the etching process, the dielectric layer 170' is patterned into inter-poly dielectric layers 172 and dielectric layers 174. The remaining dielectric portions 170VI and 170VO of the dielectric layer 170' (referring to FIG. 19) may respectively form the inter-poly dielectric layers 172 and dielectric layers 174. In the present embodiments, each of the inter-poly dielectric layers 172 has a portion 172V between the gate electrode 162/164 and the field plate electrode 191/194 and a portion 172H below the field plate electrode 191/194. Since the portion 172V between the gate electrode 162/164 and the field plate electrode 191/194 is formed by a film deposition process, the space (or pitch) between the poly field plate and the main gate can be controlled by the deposited film thickness, not limited by lithography resolution. By fabricated with a narrow space (or pitch) between the poly field plate and the main gate, the formed 1.5T poly field BCD may have low on-resistance ($R_{dson}$) and gate charge ($Q_g$), and therefore gain a lower factor of merit (FOM). In some embodiments, each of the dielectric layers 174 is on a side of the gate electrode 162/164 facing away from the field plate electrode 191/194.

In some embodiments, through the etching process, in the high voltage region HR, the gate dielectric layer 150' is patterned into gate dielectric layers 152 and 154. In some embodiments, the etched gate dielectric layer 150' (e.g., the gate dielectric layer 152/154) remains below the gate electrode 162/164 and the field plate electrode 191/194. In some embodiments, the gate dielectric layer 152/154 may be over the high voltage well region HW and the drift region (e.g., a portion of the lightly doped region 110HL), the gate electrode 162/164 over the gate dielectric layer 152/154 may vertically overlap the high voltage well region HW, and the field plate electrode 191/194 4 over the gate dielectric layer 152/154 may vertically overlap the drift region (e.g., a portion of the lightly doped region 110HL). Also, in some embodiments, through the etching process, in the logic region LR, the gate dielectric layer 180 is patterned into the gate dielectric layer 180' below the logic gate electrode 198.

Figure 20B:
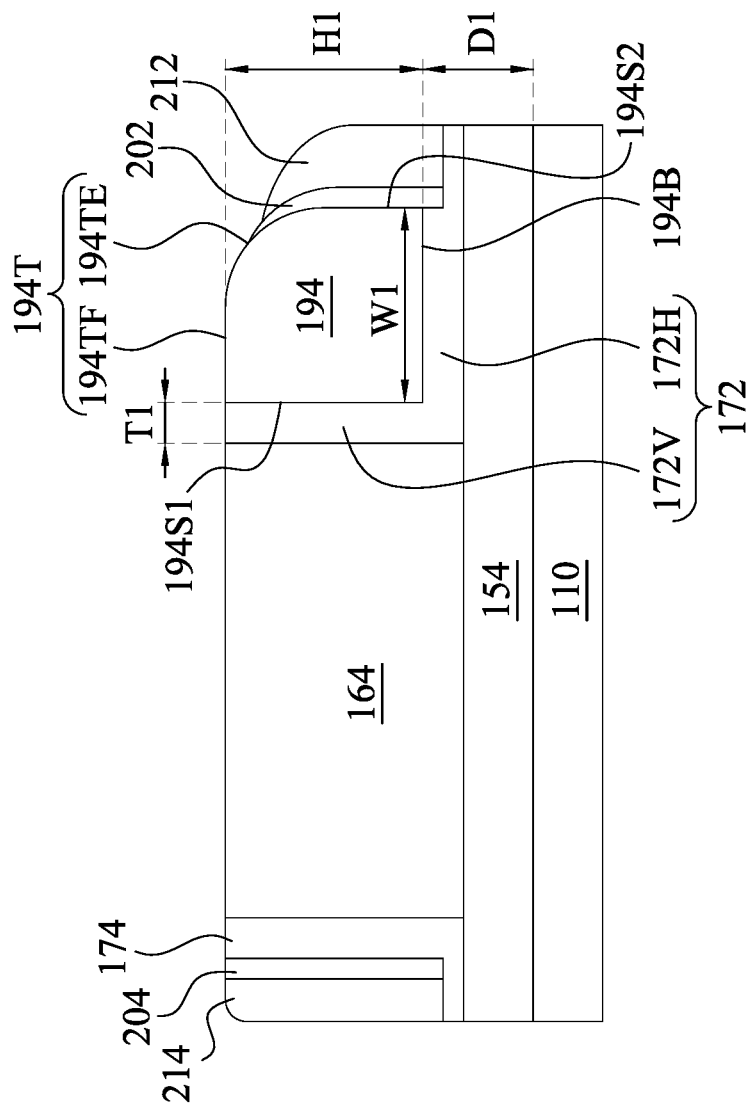

FIG. 20B is an enlarged cross-sectional view of a semiconductor device of the IC structure of FIG. 20A. In some embodiments of the present disclosure, due to the self-align etching process, shapes of the formed field plate electrode 194 may be adjusted by tuning the etching parameters. For example, in the present embodiments, the field plate electrode 194 has opposite sidewalls 194S1 and 194S2, a bottom surface 194B connected between bottom ends of the sidewall 194S1 and S2, and a top surface 194T extending from a top end of the sidewall 194S1 to a top end of the sidewall 194S2. In some embodiments, the sidewall 194S1 faces the gate electrode 164, the sidewall 194S2 faces away from the gate electrode 164, and a top end of the sidewall 194S1 is higher than a top end of the sidewall 194S2. The top surface 194T of the field plate electrode 194 may have a portion 194TF extending horizontally and substantially parallel with a top surface of the semiconductor substrate 110, and a portion 194TE extending from an end of the portion 194TF to the sidewall 194S2. The portion 194TF may be a substantially flat surface and the portion 194TE may be a curve surface. In the present embodiments, a topmost portion of the top surface 194T (e.g., the portion 194TF) is substantially level with a top surface of the gate electrode 164. In some other embodiments, a topmost portion of the top surface 194T (e.g., the portion 194TF) may be higher or lower than a top surface of the gate electrode 164.

In some embodiments, the offset sidewall spacer 202 and the spacer 212 is formed on the sidewall 194S2 and the portion 194TE of the top surface 194T of the field plate electrode 194. The portion 194TE may be not be entirely covered by the offset sidewall spacer 202 and the spacer 212. For example, top ends of the offset sidewall spacer 202 and the spacer 212 are lower than a top end of the portion 194TF of the top surface 194T of the field plate electrode 194.

The dielectric layer 172 may have a portion 172V between the gate electrode 164 and the field plate electrode 194 and a portion 172H below the bottom surface of the field plate electrode 194. In some embodiments, the offset sidewall spacer 202 and the spacer 212 is alongside a sidewall 194S2 of the field plate electrode 194 and over the portion 172H of the dielectric layer 190, bottom surfaces of the offset sidewall spacer 202 and the spacer 212 are lower than the bottom surface 194B of the field plate electrode 194. In some embodiments, the deposition of the dielectric layer 170 in FIG. 9 is tuned such that the vertical portion 172V of the formed dielectric layer 172 has a thickness T1 in a range from about 100 angstroms to about 3000 angstroms. The thickness T1 may be substantially equal to a distance between a sidewall 194S1 of the field plate electrode 194 and a sidewall of the gate electrode 164. If the thickness T1 is greater than about 3000 angstroms, the on-resistance ($R_{dson}$) may be large, and the factor of merit (FOM) of BCD device may become too high. If the thickness T1 is less than about 100 angstroms, the dielectric layer 170 may breakdown when the voltages are applied on the gate electrodes 162 and 164.

In some embodiments, a distance D1 from a bottom surface 194B of the field plate electrode 194 to a top surface of the substrate 110 is in a range from about 20 angstroms to about 500 angstroms. In some embodiments, the distance D1 is substantially equal to a thickness of the dielectric material below the field plate electrode 194 (e.g., a combination of the horizontal portion 172H of the formed dielectric layer 172 and the gate dielectric layer 154). In some alternative embodiments, the formation of the field plate electrode may consume the underlying dielectric material, and the distance D1 may substantially equal to a remain portion of the dielectric material below the field plate electrode 194 (e.g., a portion of the gate dielectric layer 154). If the distance D1 is greater than about 500 angstroms, the field plate electrodes 191 and 194 may not effectively manipulating electric fields (e.g., reducing peak electric fields) generated by the gate electrodes 162 and 164, and the hot carrier issue may become serious. If the distance D1 is less than about 20 angstroms, the dielectric material (e.g., the gate dielectric layer 150 and the dielectric layer 170) may breakdown when the carriers flow through the channel.

In some embodiments, the deposition of the gate electrode layer 190 is tuned such that a height H1 of the formed field plate electrode 194 is in a range from about 300 angstroms to about 1500 angstroms, and a width W1 of the formed field plate electrode 194 is in a range from about 300 angstroms to about 1500 angstroms. If the height H1 is greater than about 1500 angstroms, it may unnecessarily take a long time to etch the gate electrode layer 190 in subsequently process. If the height H1 is less than about 300 angstroms, it is difficult to deposit a uniform polysilicon layer. If the width W1 is greater than about 1500 angstroms, the deposited polysilicon layer may get thicker, and it may unnecessarily take a long time to etch the polysilicon layer to form the field plate electrode 194. If the width W1 is less than about 300 angstroms, it is difficult to deposit a uniform polysilicon layer.

Figure 21A:
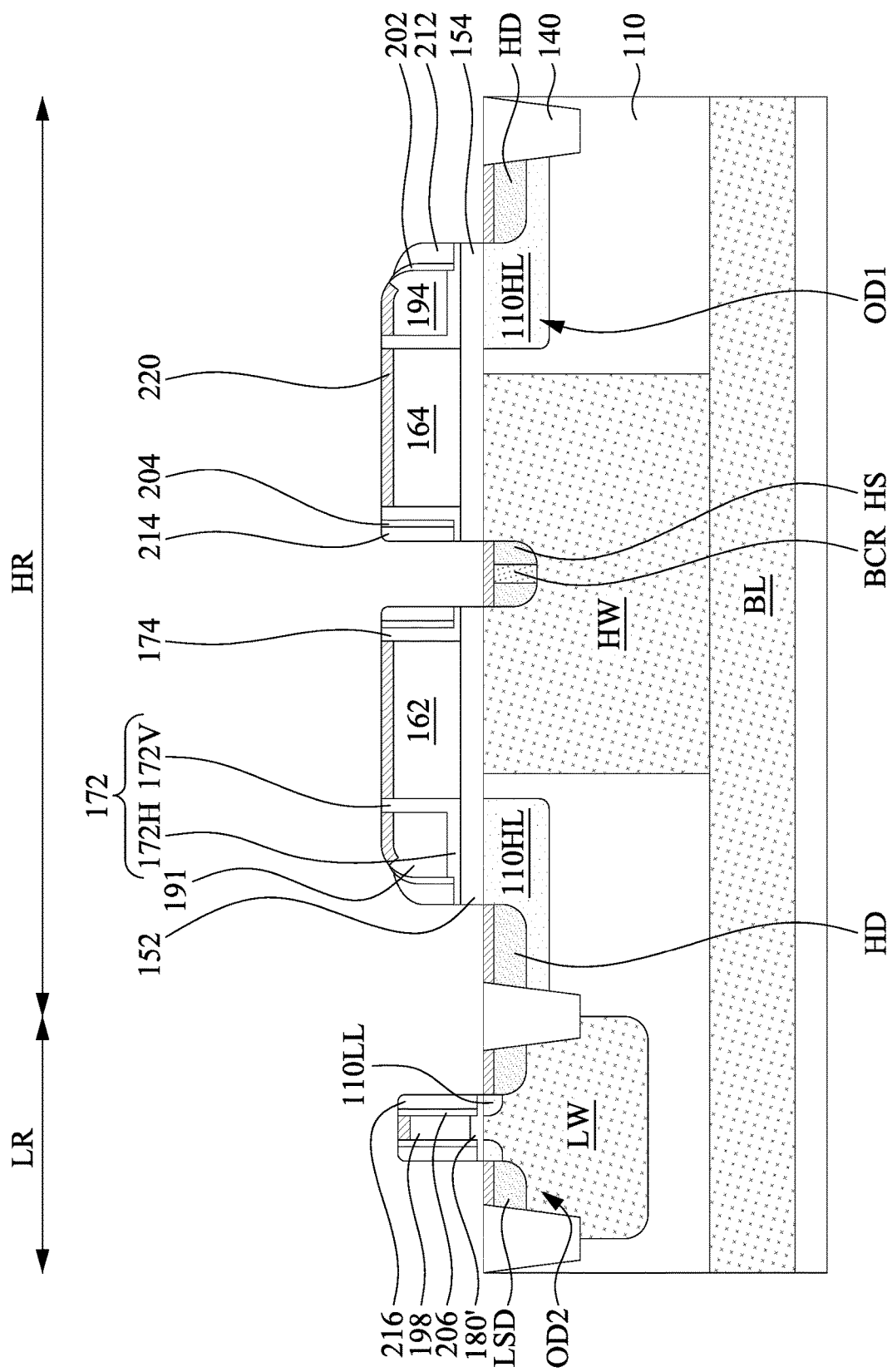
Figure 21B:
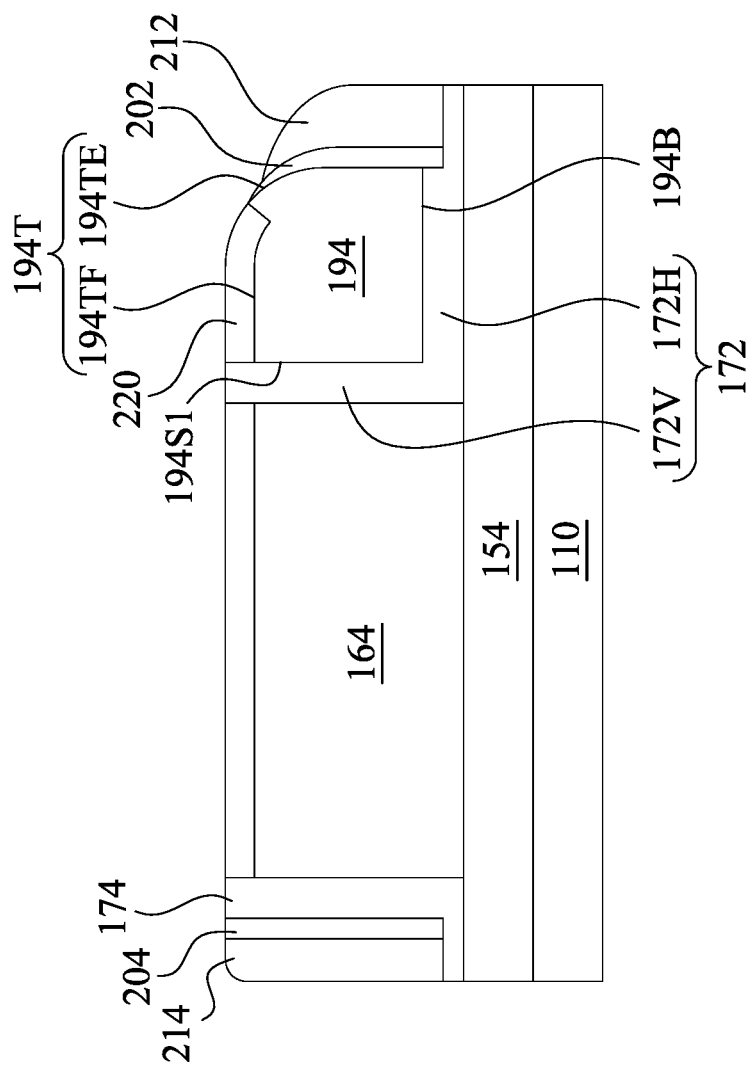

Reference is made to FIG. 21A. Through silicidation process, metal silicide layers 220 are formed over top sides of the source/drain regions LSD, the drain region HD, the source region HS, the body contact region BCR, the logic gate electrode 198, the gate electrodes 162 and 164, and the field plate electrodes 191 and 194. The silicidation process may include depositing a metal layer (e.g., a nickel layer or a cobalt layer) over the source/drain regions LSD, the drain region HD, the source region HS, the body contact region BCR, the logic gate electrode 198, the gate electrodes 162 and 164, and the field plate electrodes 191 and 194. Then, the metal layer is annealed such that the metal layer reacts with silicon (and germanium if present) in the source/drain regions LSD, the drain region HD, the source region HS, the body contact region BCR, the logic gate electrode 198, the gate electrodes 162 and 164, and the field plate electrodes 191 and 194 to form the metal silicide layers 220 (e.g., nickel silicide or cobalt silicide). The non-reacted portions of the metal layer may be removed thereafter. FIG. 21B is an enlarged cross-sectional view of a semiconductor device of the IC structure of FIG. 21A. The silicidation process is performed such that a metal silicide layer 220 is formed on the exposed part of the portion 194TF of the top surface 194T of the field plate electrode 194 and the top surface of the gate electrode 164. In some embodiments, according to the profile of the field plate electrode 191/194, the metal silicide layer 220 on the field plate electrode 191/194 has first and second portions, the gate electrode 162/164 is closer to the first portion than the second portion, and the first portion of the metal silicide layer 220 is higher than the second portion of the metal silicide layer 220.

Figure 22:
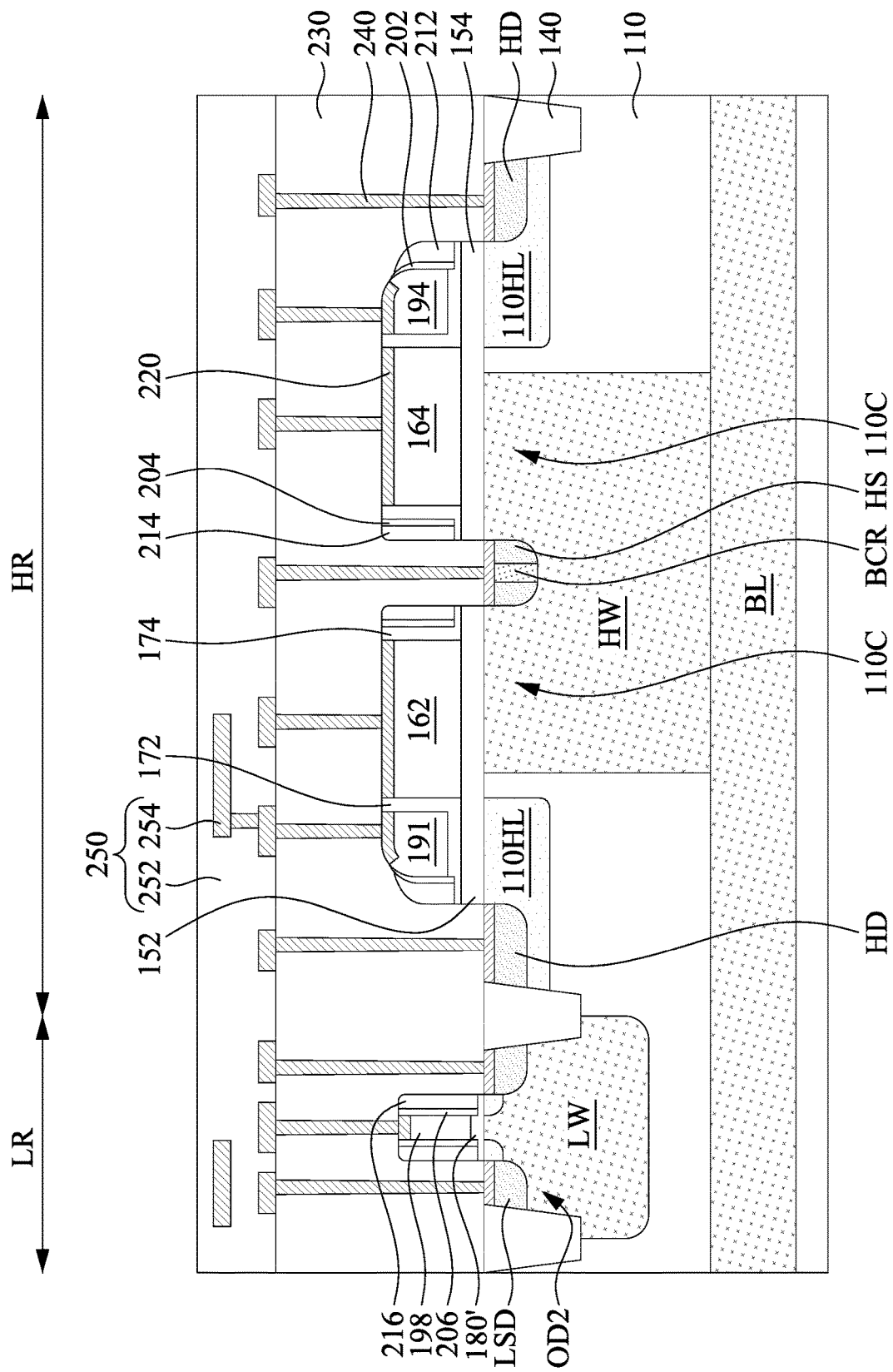

Reference is made to FIG. 22. An interlayer dielectric (ILD) layer 230 is formed over the structure of FIG. 21A, and then plural contacts 240 are formed in the ILD layer 230 and respectively landing on the metal silicide layers 220. In some embodiments, the ILD layer 230 may include an oxide (e.g., SiO$_2$), an ultra-low k dielectric material, a low-k dielectric material (e.g., SiCO), the like, or combinations thereof. In some embodiments, the ILD layer 230 may be formed by a vapor deposition process. The ILD layer 230 is etched to form contact openings therein, in which the contact openings may expose the metal silicide layers 220. The contact openings are filled with one or more conductive materials. In some embodiments, the one or more conductive materials may include tungsten (W), cobalt, copper, titanium (Ti), titanium nitride (TiN), tantalum nitride (TaN), the like, or combinations thereof. In some embodiments, a diffusion barrier layer and/or a liner layer may be deposited into the contact openings prior to depositing the one or more conductive materials. In some embodiments, the one or more conductive materials may be deposited by way of a vapor deposition technique (e.g., CVD, PVD, plasma-enhanced CVD (PE-CVD), etc.) and/or a plating process (e.g., an electroplating or electro-less plating process). A planarization process (e.g., CMP) may be subsequently performed to remove excess of the one or more conductive materials and to form a substantially planar surface, thereby forming plural contacts 240 in the ILD layer 230.

Subsequently, an interconnect structure 250 is formed over the ILD layer 230. The interconnect structure 250 may include plural dielectric layers 252 and a metallization pattern 254 embedded in the dielectric layers 252. The metallization pattern 254 may include plural metal lines or metal vias to form suitable circuits in the high voltage region HR and the logic region LR. In some embodiments, the dielectric layers 252 may include an oxide (e.g., SiO$_2$), an ultra-low k dielectric material, a low-k dielectric material (e.g., SiCO), the like, or combinations thereof. In some embodiments, the metallization pattern 254 may include tungsten (W), cobalt, copper, titanium (Ti), titanium nitride (TiN), tantalum nitride (TaN), the like, or combinations thereof.

Through these steps, a logic transistor device and high voltage transistor devices can be respectively formed in the logic region LR and the high voltage region HR. In some embodiments of the present disclosure, field plate electrodes 191 and 194 are placed to enhance the performance of the high voltage transistor device by manipulating electric fields (e.g., reducing peak electric fields) generated by the gate electrodes 162 and 164. By manipulating the electric field generated by the gate electrodes 162 and 164, a hot carrier effect in the high voltage transistor device can be suppressed, thereby achieving higher breakdown voltages. For example, the high voltage transistor device may be a LDMOS transistor having the field plate electrode 191/194 over a drift region (e.g., LDD region 110HL) disposed between the channel region 110C below the gate ate electrode 162/164 and the drain region HD. In some embodiments, the field plate electrode 191/194 vertically overlaps the drift region (e.g., LDD region 110HL).

Figure 23A:
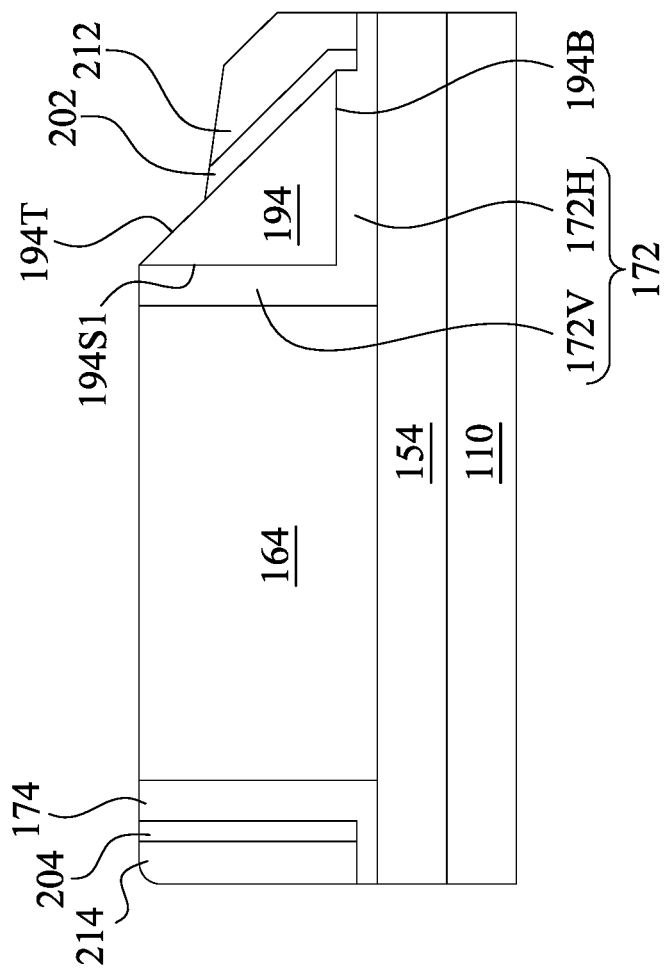
FIGS. 23A and 23B illustrate cross-sectional views of a semiconductor device of an IC structure according to some embodiments of the present disclosure.
Figure 23B:
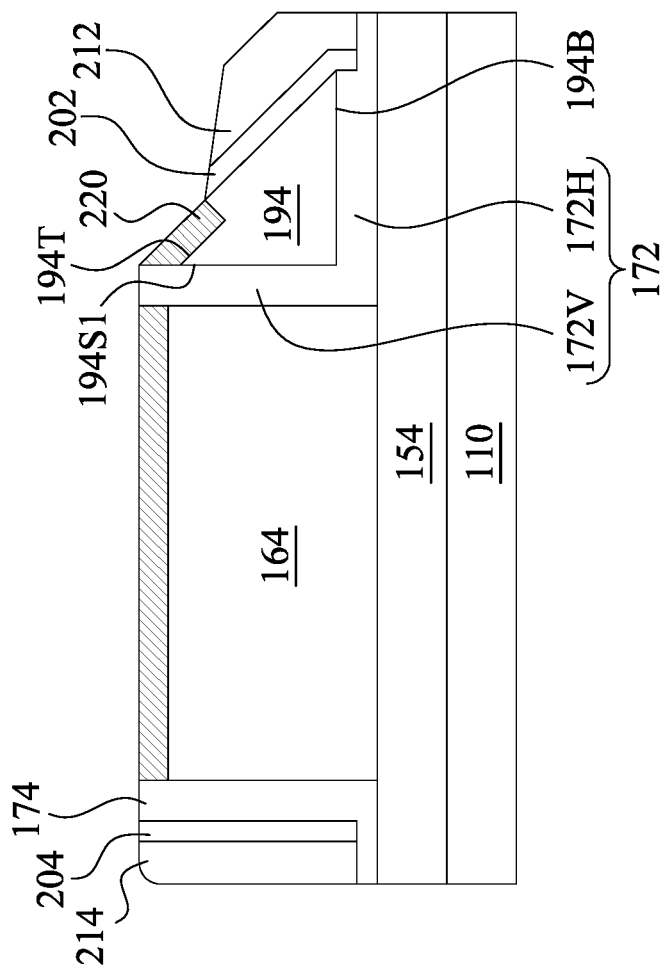

FIGS. 23A and 23B illustrate cross-sectional views of a semiconductor device of an IC structure according to some embodiments of the present disclosure. The present embodiments are similar to the embodiments of FIGS. 1-22, except that the formed field plate electrodes (e.g., the field plate electrode 194) may have a substantially triangular shape. Referring to FIG. 23A, by tuning etch parameters while patterning the gate electrode layer 190 (referring to FIG. 14), the formed field plate electrodes (e.g., the field plate electrode 194) may have a slanted top surface 194T extending from a top end of the sidewall 194S1 of the field plate electrode 194 to the bottom surface 194B of the field plate electrode 194. In some embodiments, the offset sidewall spacer 202 and the spacer 212 cover a portion of the slanted top surface 194T of the field plate electrode 194 and expose another portion of the slanted top surface 194T of the field plate electrode 194. Subsequently, referring to FIG. 23B, a silicidation process is performed such that metal silicide layers 220 are formed respectively on the exposed portion of the slanted top surface 194T of the field plate electrode 194 and the top surface of the gate electrode 164. Other details of the present embodiments are similar to those illustrated in the previously described embodiments and thus will not be repeated herein.

Figure 24A:
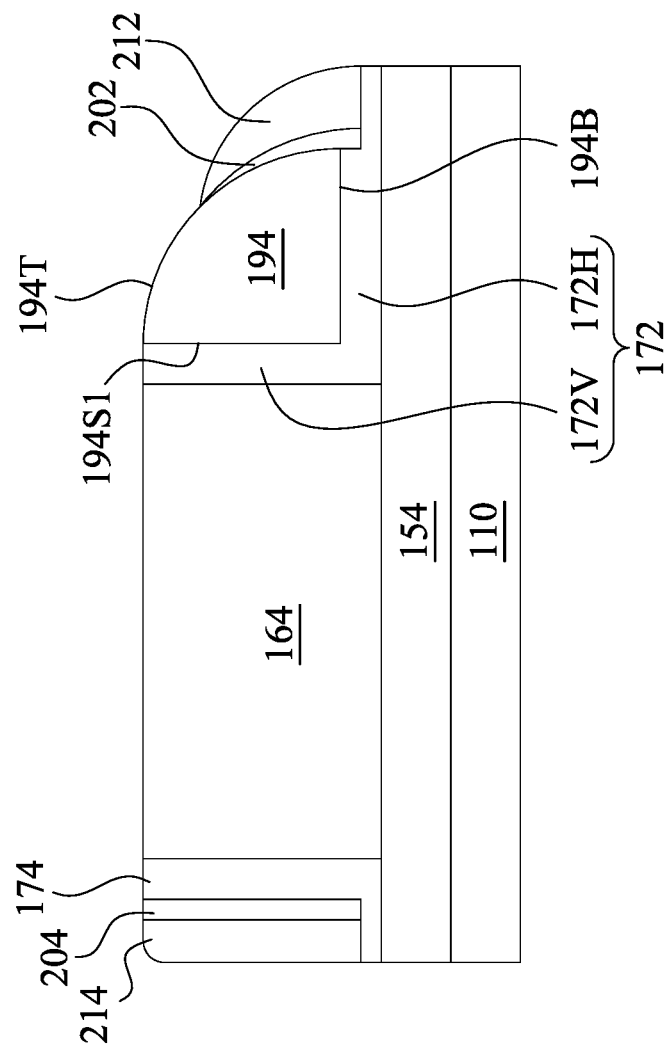
FIGS. 24A and 24B illustrate cross-sectional views of a semiconductor device of an IC structure according to some embodiments of the present disclosure.
Figure 24B:
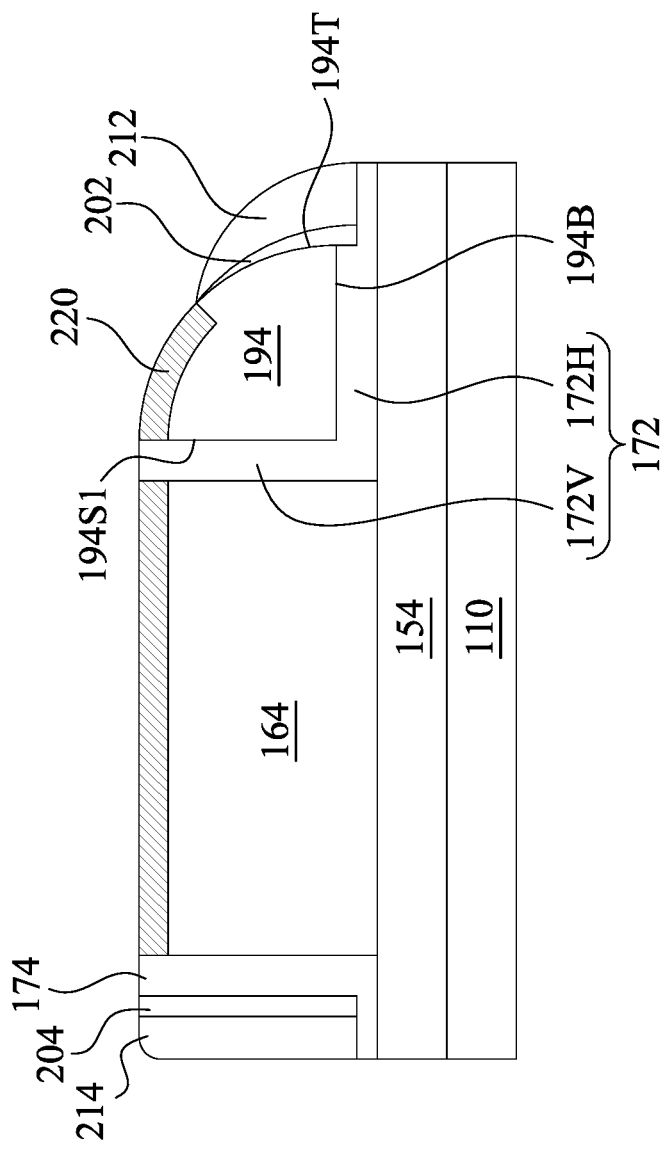

FIGS. 24A and 24B illustrate cross-sectional views of a semiconductor device of an IC structure according to some embodiments of the present disclosure. The present embodiments are similar to the embodiments of FIGS. 23A and 23B, except that the formed field plate electrodes (e.g., the field plate electrode 194) may have a spacer shape. Referring to FIG. 24A, by tuning etch parameters while patterning the gate electrode layer 190 (referring to FIG. 14), the formed field plate electrodes (e.g., the field plate electrode 194) may a curved top surface 194T extending from a top end of the sidewall 194S1 of the field plate electrode 194 to the bottom surface 194B of the field plate electrode 194. In some embodiments, the offset sidewall spacer 202 and the spacer 212 cover a portion of the curved top surface 194T of the field plate electrode 194 and expose another portion of the curved top surface 194T of the field plate electrode 194. Subsequently, referring to FIG. 24B, a silicidation process is performed such that metal silicide layers 220 are formed respectively on the exposed portion of the curved top surface 194T of the field plate electrode 194 and the top surface of the gate electrode 164. Other details of the present embodiments are similar to those illustrated in the previously described embodiments and thus will not be repeated herein.

Figure 25A:
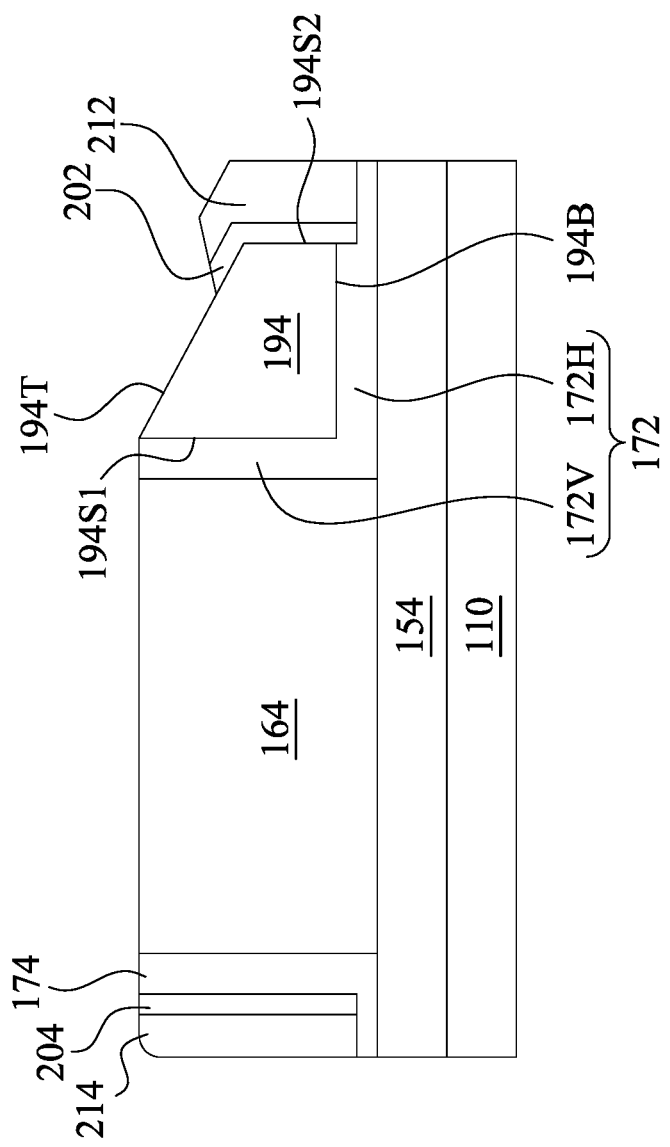
FIGS. 25A and 25B illustrate cross-sectional views of a semiconductor device of an IC structure according to some embodiments of the present disclosure.
Figure 25B:
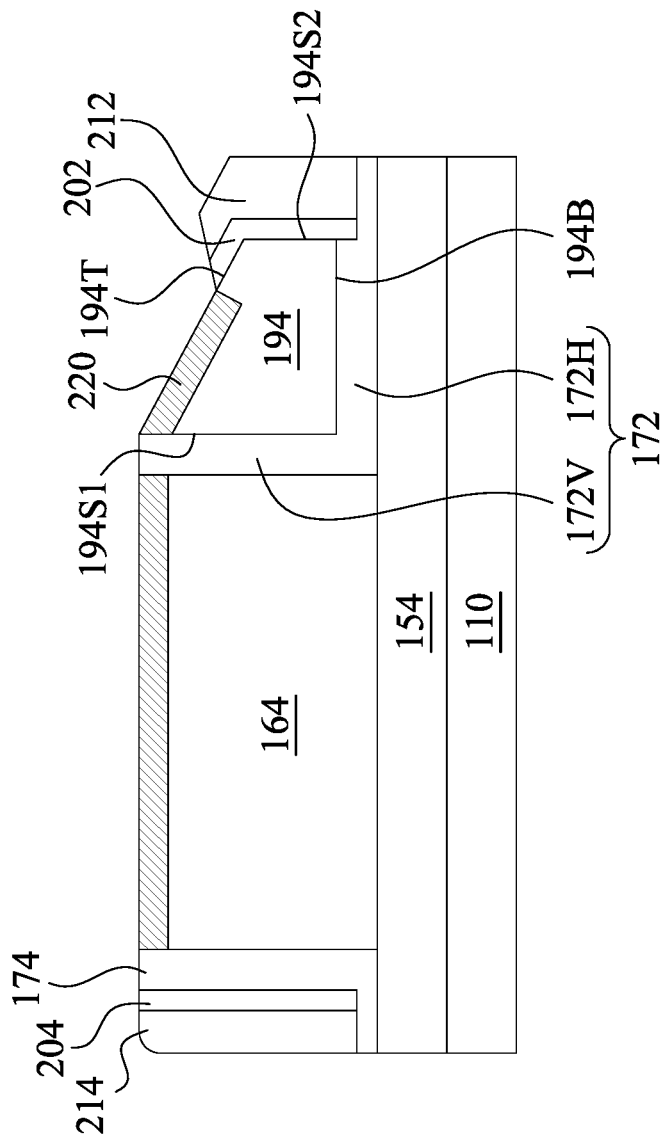

FIGS. 25A and 25B illustrate cross-sectional views of a semiconductor device of an IC structure according to some embodiments of the present disclosure. The present embodiments are similar to the embodiments of FIGS. 1-22, except that the formed field plate electrodes (e.g., the field plate electrode 194) may have a substantially polygonal shape. For example, the field plate electrode 194 has a slanted top surface 194T extending from a top end of the sidewall 194S1 of the field plate electrode 194 to a top end of the sidewall 194S2 of the field plate electrode 194. This configuration of the field plate electrodes (e.g., the field plate electrode 194) can be achieved by tuning etch parameters while patterning the gate electrode layer 190 (referring to FIG. 14). In some embodiments, the offset sidewall spacer 202 and the spacer 212 cover a portion of the slanted top surface 194T of the field plate electrode 194 and the sidewall 194S2 of the field plate electrode 194, and expose another portion of the slanted top surface 194T of the field plate electrode 194. Subsequently, referring to FIG. 25B, a silicidation process is performed such that metal silicide layers 220 are formed respectively on the exposed portion of the slanted top surface 194T of the field plate electrode 194 and the top surface of the gate electrode 164. Other details of the present embodiments are similar to those illustrated in the previously described embodiments and will not be repeated herein.

Figure 26A:
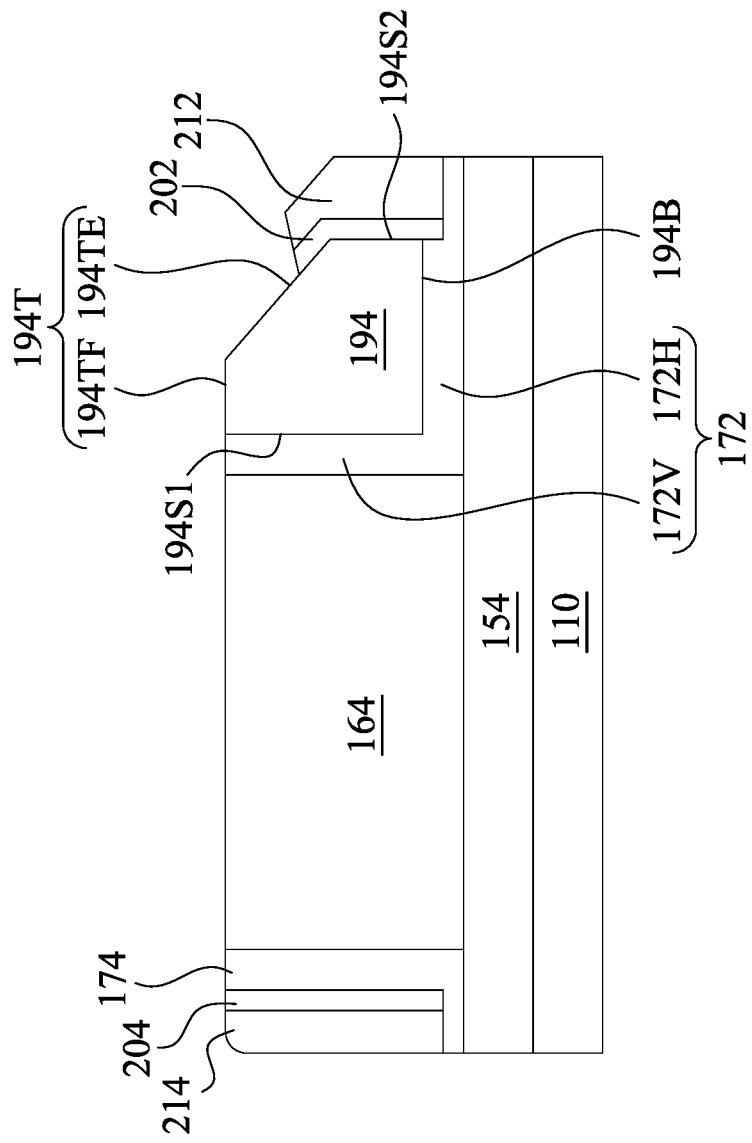
FIGS. 26A and 26B illustrate cross-sectional views of a semiconductor device of an IC structure according to some embodiments of the present disclosure.
Figure 26B:
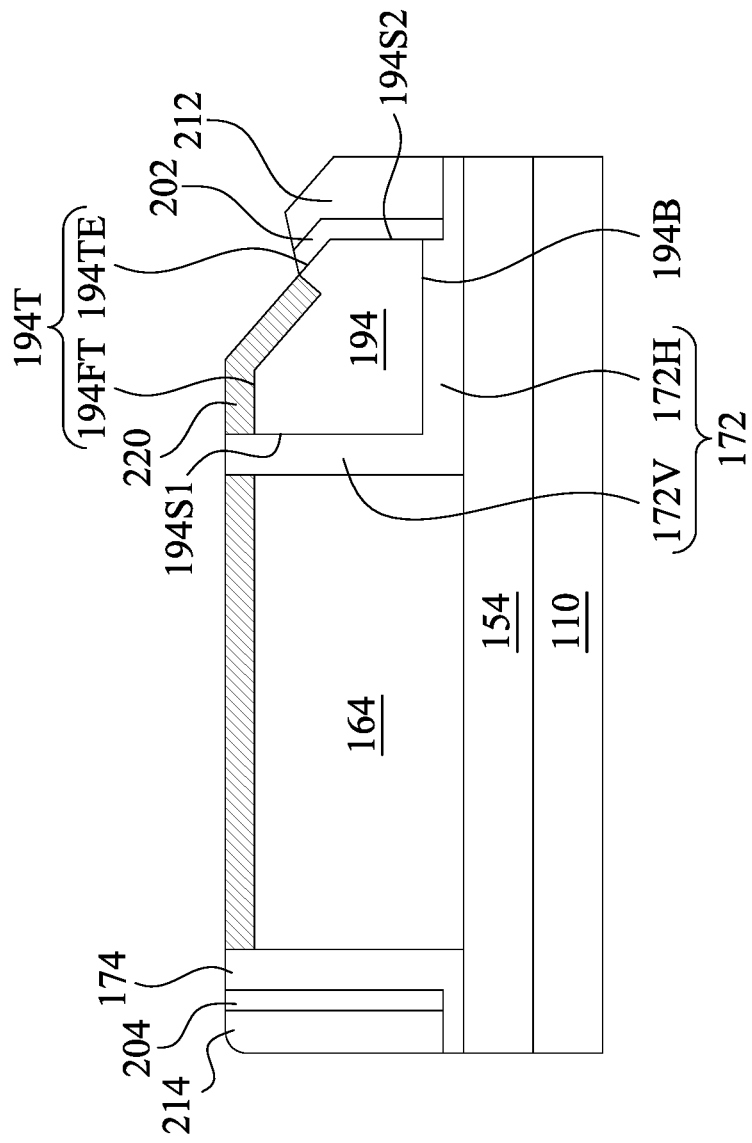

FIGS. 26A and 26B illustrate cross-sectional views of a semiconductor device of an IC structure according to some embodiments of the present disclosure. The present embodiments are similar to the embodiments of FIGS. 1-22, except that the formed field plate electrodes (e.g., the field plate electrode 194) may have a substantially polygonal shape. For example, the portion 194TE of the top surface 194T of the field plate electrode 194 is a slanted top surface extending from the portion 194TF of the top surface 194T to a top end of the sidewall 194S2 of the field plate electrode 194. This configuration of the field plate electrodes (e.g., the field plate electrode 194) can be achieved by tuning etch parameters while patterning the gate electrode layer 190 (referring to FIG. 14). In some embodiments, the offset sidewall spacer 202 and the spacer 212 cover a part of the portion 194TE, and expose another part of the portion 194TE. Subsequently, referring to FIG. 26B, a silicidation process is performed such that metal silicide layers 220 are formed respectively on the exposed part of the portion 194TE of the top surface 194T of the field plate electrode 194 and the top surface of the gate electrode 164. Other details of the present embodiments are similar to those illustrated in the previously described embodiments and will not be repeated herein.

Figure 27B:
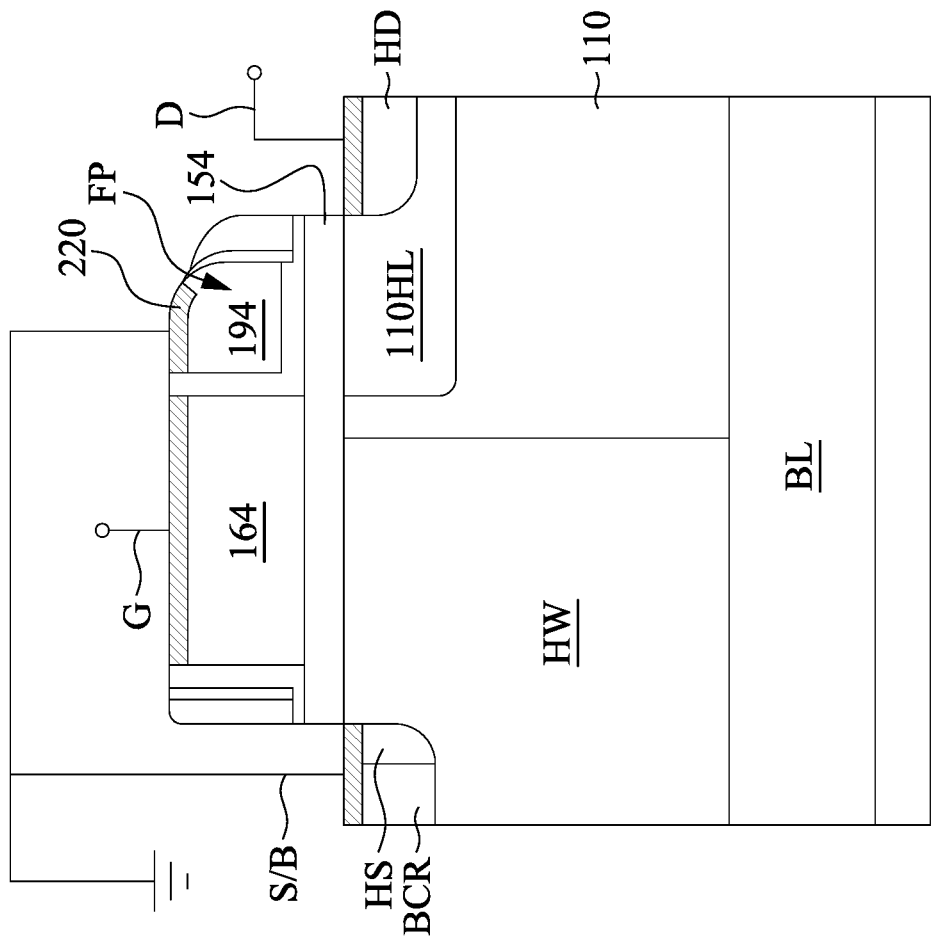
FIG. 27B is a schematic cross-sectional view of the semiconductor device of FIG. 27A.
Figure 27A:
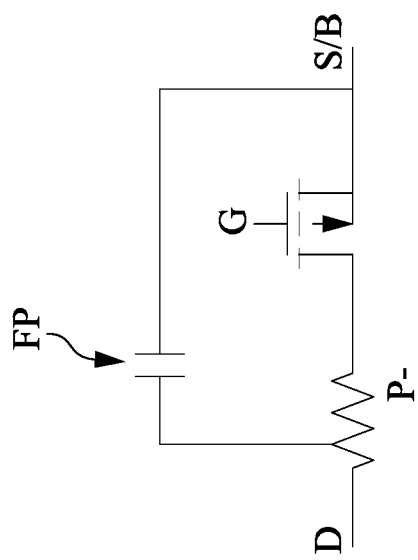
FIG. 27A is an equivalent circuit diagram of a semiconductor device according to some embodiments of the present disclosure.

FIG. 27A is an equivalent circuit diagram of a semiconductor device according to some embodiments of the present disclosure. FIG. 27B is a schematic cross-sectional view of the semiconductor device of FIG. 27A. In the present embodiments, the semiconductor device is a PLDMOS device, and the PLDMOS device includes a gate terminal G, a source and bulk terminal S/B, a drain terminal D, and a field plate FP. The field plate FP may act as a capacitor between the source and bulk terminal SIB and the drain terminal D. The field plate FP can manipulate the electric field generated by the gate, thereby suppressing a hot carrier effect in the high voltage transistor device and achieving higher breakdown voltages. The p-type LDD region 110HL may result in electrical resistance in the device, which is illustrate as a p-type resistor in the figure. In some embodiments, the field plate electrode FP may be biased by the source voltage, for example, grounded as illustrated in the figure. For example, the metallization pattern 254 in FIG. 22 may create an electrical path from one of the contacts 240 abutting the source region HS to another one of the contacts 240 abutting the field plate electrode 194.

Figure 28:
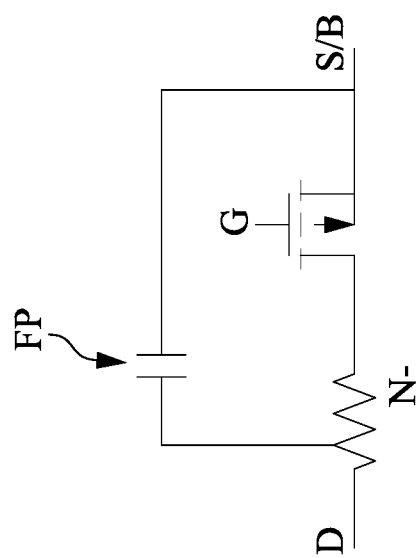
FIG. 28 is an equivalent circuit diagram of a semiconductor device according to some embodiments of the present disclosure.

FIG. 28 is an equivalent circuit diagram of a semiconductor device according to some embodiments of the present disclosure. The present embodiments are similar to the embodiments of FIGS. 27A and 27B, except that the semiconductor device is a NLDMOS device. For example, the NLDMOS device has a p-type high voltage well region HW, an n-type LDD region 110HL, an n-type source region HS, an n-type drain region HD, and a p-type body contact region BCR. The n-type LDD region 110HL may result in electrical resistance in the device, which is illustrate as an n-type resistor in the figure. Other details of the semiconductor device of FIG. 28 may be similar to those illustrated in FIGS. 27A and 27B and will not be repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a space (or pitch) between poly field plate and main gate can be controlled by the inter-poly dielectric thickness, not limited by lithography resolution. By fabricated with a narrow space (or pitch) between the poly field plate and the main gate, the formed 1.5T poly field BCD may have low on-resistance ($R_{dson}$) and gate charge ($Q_g$), and therefore a lower factor of merit (FOM) is obtained. Another advantage is that the inter-poly dielectric can fill between poly field plate and main gate, thereby avoiding SID implant shoot through. Still another advantage is that a sidewall etch (self-align) method is utilized to form the poly field plate, thereby saving a mask. Still another advantage is that shapes of the poly field plates can be adjusted by tuning the etching recipes used in the sidewall etch (self-align) method.

According to some embodiments of the present disclosure, a method includes forming a gate dielectric layer over a semiconductor substrate, wherein the semiconductor substrate has a well region therein; depositing a first gate electrode layer over the gate dielectric layer; etching the first gate electrode layer to form a gate electrode over the gate dielectric layer and vertically overlapping the well region of the semiconductor substrate; forming a drift region in the semiconductor substrate; depositing a dielectric layer over the gate dielectric layer and the gate electrode, wherein the dielectric layer has a first portion alongside a first sidewall of the gate electrode; depositing a second gate electrode layer over the dielectric layer; etching the second gate electrode layer to form a field plate electrode alongside the first portion of the dielectric layer and vertically overlapping the drift region; and forming a first source/drain feature in the well region and a second source/drain feature in the semiconductor substrate, in which the drift region is laterally between the first source/drain feature and the second source/drain feature.

According to some embodiments of the present disclosure, an integrated circuit structure includes a semiconductor substrate, a first source/drain feature, a second source/drain feature, a gate dielectric layer, a gate electrode, a field plate electrode, and a dielectric layer. The semiconductor substrate has a well region and a drift region therein. The first source/drain feature is in the well region. The second source/drain feature is in the semiconductor substrate, wherein the drift region is between the well region and the second source/drain feature. The gate dielectric layer is over the well region and the drift region. The gate electrode is over the gate dielectric layer and vertically overlapping the well region. The field plate electrode is over the gate dielectric layer and vertically overlapping the drift region, wherein a bottom surface of the field plate electrode is higher than a bottom surface of the gate electrode. The dielectric layer is between the gate electrode and the field plate electrode.

According to some embodiments of the present disclosure, the integrated circuit structure includes a semiconductor substrate, first and second source/drain features, a gate dielectric layer, a gate electrode, a field plate electrode, and a dielectric layer. The semiconductor substrate has a channel region and a drift region therein. The drift region and the channel region are between the first and second source/drain features. The gate dielectric layer is over the channel region and the drift region. The gate electrode is over the gate dielectric layer and vertically overlapping the channel region. The field plate electrode is over the gate dielectric layer and vertically overlapping the drift region, wherein the field plate electrode tapers away from the gate electrode. The dielectric layer is between the gate electrode and the field plate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate dielectric layer over a semiconductor substrate, wherein the semiconductor substrate has a well region therein;
    depositing a first gate electrode layer over the gate dielectric layer;
    etching the first gate electrode layer to form a gate electrode over the gate dielectric layer and vertically overlapping the well region of the semiconductor substrate;
    forming a drift region in the semiconductor substrate;
    depositing a dielectric layer over the gate dielectric layer and the gate electrode, wherein the dielectric layer has a first portion alongside a first sidewall of the gate electrode;
    depositing a second gate electrode layer over the dielectric layer;
    etching the second gate electrode layer to form a field plate electrode alongside the first portion of the dielectric layer and vertically overlapping the drift region;
    after etching the second gate electrode layer to form the field plate electrode, etching the gate dielectric layer, such that a portion of a top surface of the semiconductor substrate is exposed, and the etched gate dielectric layer remains below the gate electrode and the field plate electrode; and
    forming a first source/drain feature in the well region and a second source/drain feature in the semiconductor substrate, wherein the drift region is laterally between the first source/drain feature and the second source/drain feature.

2. The method of claim 1, further comprising:
    forming a spacer alongside a sidewall of the field plate electrode facing away from the first portion of the dielectric layer after etching the second gate electrode layer to form the field plate electrode.

3. The method of claim 1, wherein forming the first source/drain feature in the well region and the second source/drain feature in the semiconductor substrate is performed after etching the second gate electrode layer to form the field plate electrode.

4. The method of claim 1, wherein depositing the dielectric layer is performed such that the dielectric layer has a second portion alongside a second sidewall of the gate electrode, etching the second gate electrode layer is performed such that a dummy field plate electrode is formed alongside the second portion of the dielectric layer; and
    further comprising: etching the dummy field plate electrode prior to forming the first and second source/drain features.

5. The method of claim 4, further comprising:
    forming a spacer alongside a sidewall of the second portion of the dielectric layer facing away from the gate electrode after etching the dummy field plate electrode.

6. The method of claim 1, wherein depositing the dielectric layer is performed such that the dielectric layer has a third portion extending along a top surface of the gate dielectric layer, and etching the second gate electrode layer to form the field plate electrode is performed such that the field plate electrode is formed over the third portion of the dielectric layer.

7. The method of claim 1, wherein depositing the dielectric layer is performed such that the dielectric layer has a fourth portion over a top surface of the gate electrode; and
    further comprising: removing the fourth portion of the dielectric layer from the top surface of the gate electrode after etching the second gate electrode layer to form the field plate electrode.

8. A method, comprising:
    forming a gate dielectric layer over a semiconductor substrate;
    forming a gate electrode over the gate dielectric layer;
    depositing a dielectric layer over the gate electrode and the gate dielectric layer, wherein the dielectric layer has a first portion extending along a top surface of the gate dielectric layer and a second portion extending along a sidewall of the gate electrode;

forming a field plate electrode over the first portion of the dielectric layer, wherein the second portion of the dielectric layer is between the gate electrode and the field plate electrode;

forming a spacer over the first portion of the dielectric layer and on a sidewall of the field plate electrode, wherein a top surface of the second portion of the dielectric layer is higher than a top end of the spacer; and after forming the spacer, forming source and drain features in the semiconductor substrate.

9. The method of claim 8, wherein forming the field plate electrode comprises:

depositing a field plate electrode layer over the dielectric layer and the gate electrode; and etching back the field plate electrode layer to form to the field plate electrode.

10. The method of claim 8, wherein a thickness of the dielectric layer is less than a thickness of the gate dielectric layer.

11. A method, comprising:

forming a gate dielectric layer over a semiconductor substrate;

forming a gate electrode over the gate dielectric layer;

depositing a dielectric layer over the gate electrode and the gate dielectric layer;

depositing a field plate electrode layer over the dielectric layer;

etching the field plate electrode layer to form a first field plate electrode, wherein the first field plate electrode tapers away from the gate electrode;

forming source and drain features in the semiconductor substrate; and forming a metal silicide layer over the first field plate electrode, wherein a first portion of the metal silicide layer adjacent to the gate electrode is higher than a second portion of the metal silicide layer away from the gate electrode.

12. The method of claim 11, wherein depositing the dielectric layer is performed such that the dielectric layer has a portion over a top surface of the gate electrode, and the portion of the dielectric layer remains over the top surface of the gate electrode after etching the field plate electrode layer.

13. The method of claim 12, further comprising:

removing the portion of the dielectric layer from the top surface of the gate electrode; and forming a contact over the top surface of the gate electrode.

14. The method of claim 11, wherein etching the field plate electrode layer further forms a second field plate electrode over the dielectric layer, and the gate electrode is between the first and second field plate electrodes.

15. The method of claim 14, further comprising:

removing the second field plate electrode from the dielectric layer.

16. The method of claim 11, wherein the first field plate electrode has a curved top surface.

17. The method of claim 11, wherein the first field plate electrode has a slanted top surface.

18. The method of claim 11, further comprising:

forming a contact over the metal silicide layer.

19. The method of claim 8, wherein depositing the dielectric layer is performed such that the dielectric layer has a third portion over a top surface of the gate electrode, and the method further comprises:

removing the third portion of the dielectric layer from the top surface of the gate electrode after forming the source and drain features in the semiconductor substrate.

20. The method of claim 8, wherein forming the field plate electrode is performed such that opposite sidewalls of the second portion of the dielectric layer are in contact with the gate electrode and the field plate electrode, respectively.

* * * * *